United States Patent
Ramkumar et al.

(10) Patent No.: US 12,250,815 B1
(45) Date of Patent: Mar. 11, 2025

(54) METHODS OF EQUALIZING GATE HEIGHTS IN EMBEDDED NON-VOLATILE MEMORY ON HKMG TECHNOLOGY

(71) Applicant: Infineon Technologies LLC, San Jose, CA (US)

(72) Inventors: Krishnaswamy Ramkumar, San Jose, CA (US); Shivananda Shetty, Fremont, CA (US)

(73) Assignee: Infineon Technologies LLC, San Jose, CA (US)

( * ) Notice: Subject to any disclaimer, the term of this patent is extended or adjusted under 35 U.S.C. 154(b) by 0 days.

(21) Appl. No.: 18/658,027

(22) Filed: May 8, 2024

(51) Int. Cl.
*H10B 41/35* (2023.01)

(52) U.S. Cl.
CPC .................. *H10B 41/35* (2023.02)

(58) Field of Classification Search
CPC .............. H10B 41/35; H10B 43/00–50; H01L 29/792–7926; G11C 16/0466–0475; G11C 27/005; G11C 11/5671
See application file for complete search history.

(56) References Cited

U.S. PATENT DOCUMENTS

| | | | |
|---|---|---|---|
| 9,583,499 B1* | 2/2017 | Zhu | H01L 21/32139 |
| 12,029,041 B2* | 7/2024 | Chen | H01L 29/66833 |
| 2015/0054044 A1* | 2/2015 | Perera | H01L 29/7881 257/314 |
| 2015/0060989 A1* | 3/2015 | Loiko | H01L 29/40117 438/587 |
| 2016/0013198 A1* | 1/2016 | Liu | H01L 29/42344 438/258 |
| 2016/0211250 A1* | 7/2016 | Langheinrich | H10B 41/43 |
| 2016/0267979 A1* | 9/2016 | Hong | H10B 41/43 |
| 2019/0103414 A1* | 4/2019 | Ramkumar | H01L 21/0223 |
| 2019/0304990 A1* | 10/2019 | Chen | H01L 29/66833 |
| 2020/0350213 A1* | 11/2020 | Ramkumar | H10B 43/40 |
| 2023/0081072 A1* | 3/2023 | Ramkumar | H01L 29/792 438/258 |
| 2023/0230883 A1* | 7/2023 | Yoshida | H01L 21/823462 438/275 |
| 2024/0206183 A1* | 6/2024 | Chen | H10B 41/49 |

* cited by examiner

*Primary Examiner* — Khaja Ahmad
*Assistant Examiner* — Khatib A Rahman

(57) ABSTRACT

Semiconductor devices and methods of manufacturing the same are provided. The semiconductor devices may have a memory array having two transistor (2T) memory cells, each including a non-volatile memory (NVM) transistor and a high voltage (HV) field-effect transistor (FET) as a select transistor disposed within at least one recess(es). The devices further include a logic area in which HV FETs, input/output (I/) FETs, and low voltage (LV)/core FETs are formed thereon. Other embodiments are also described.

20 Claims, 19 Drawing Sheets

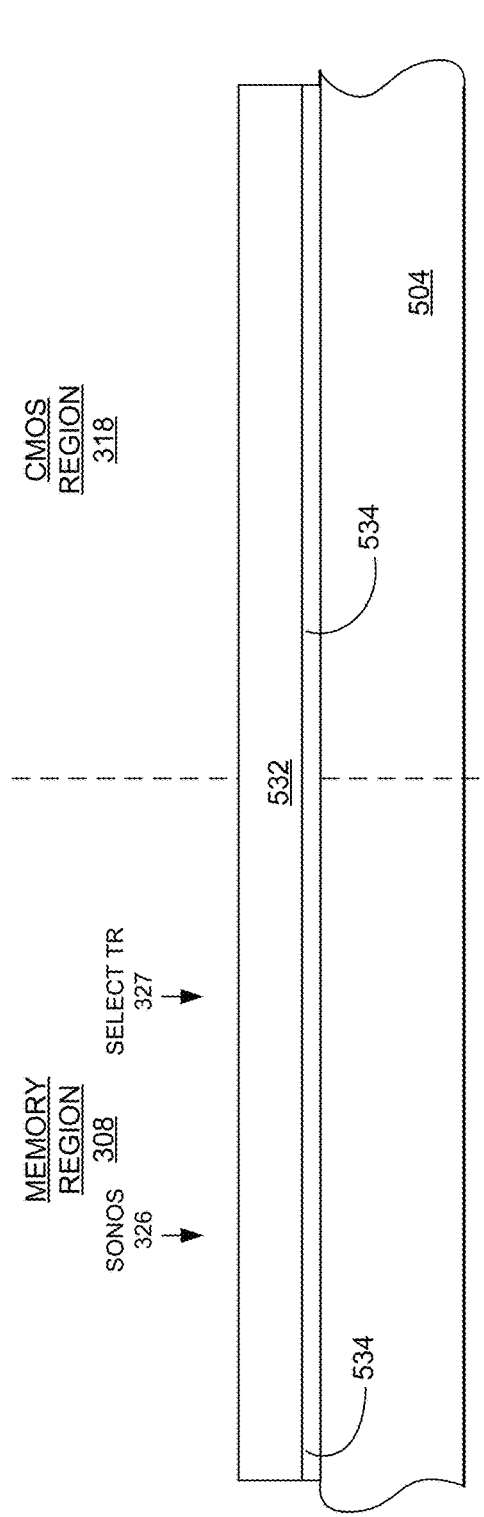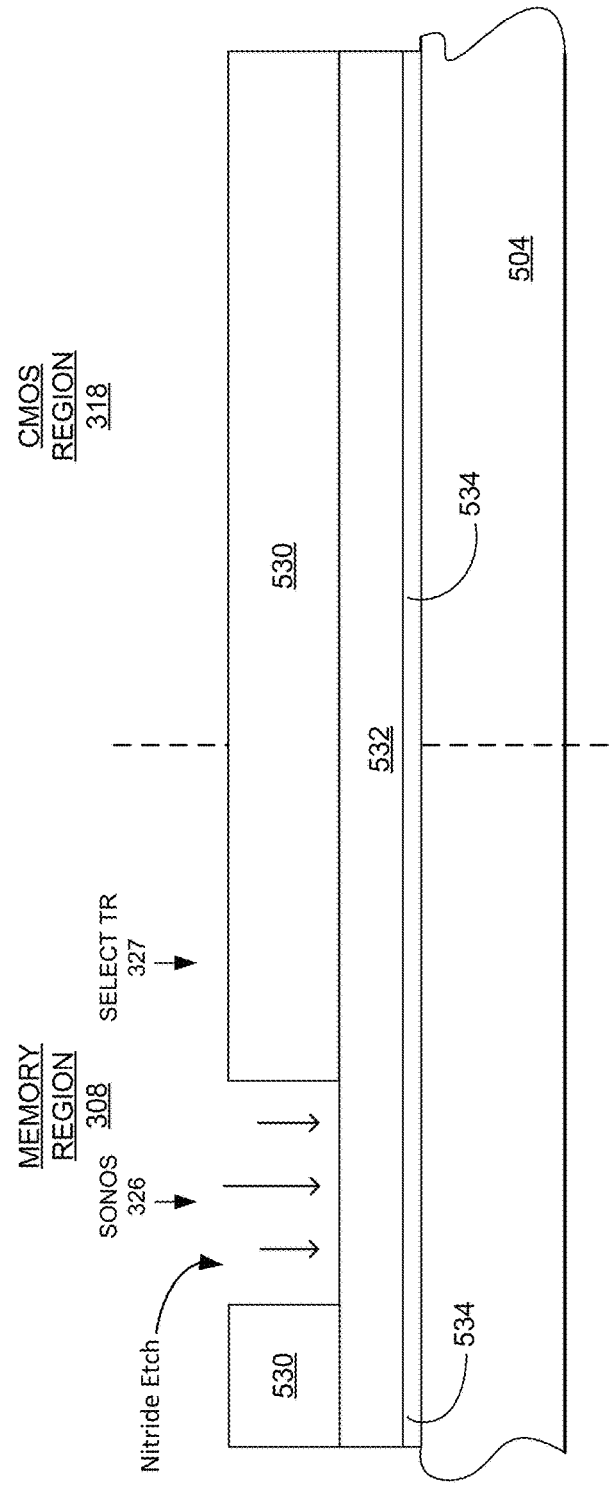

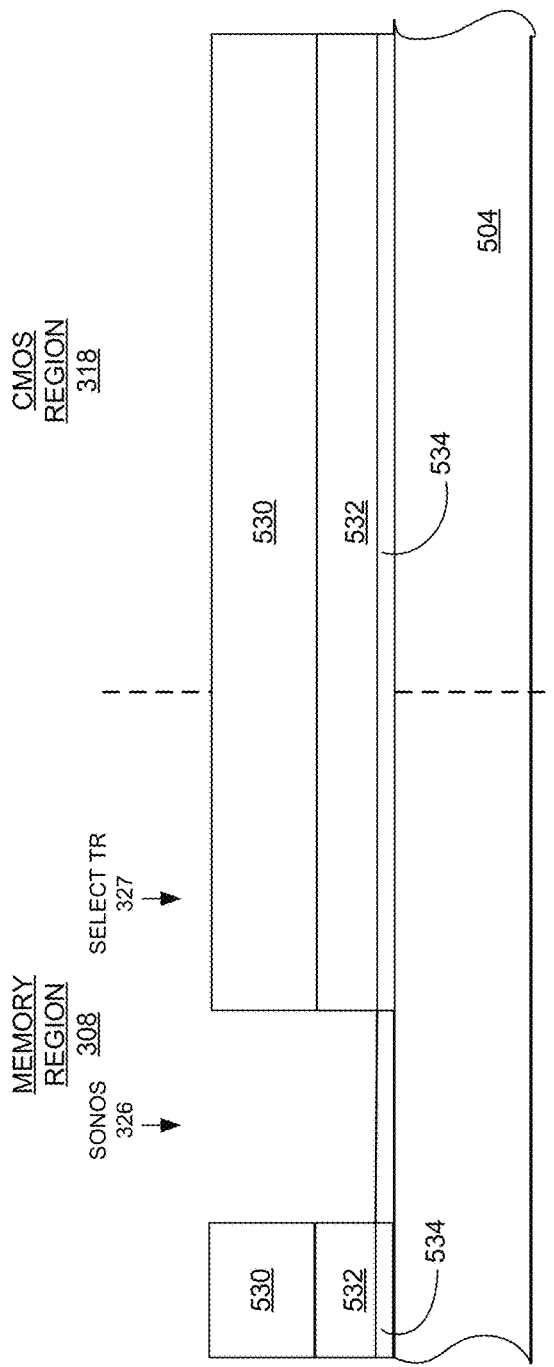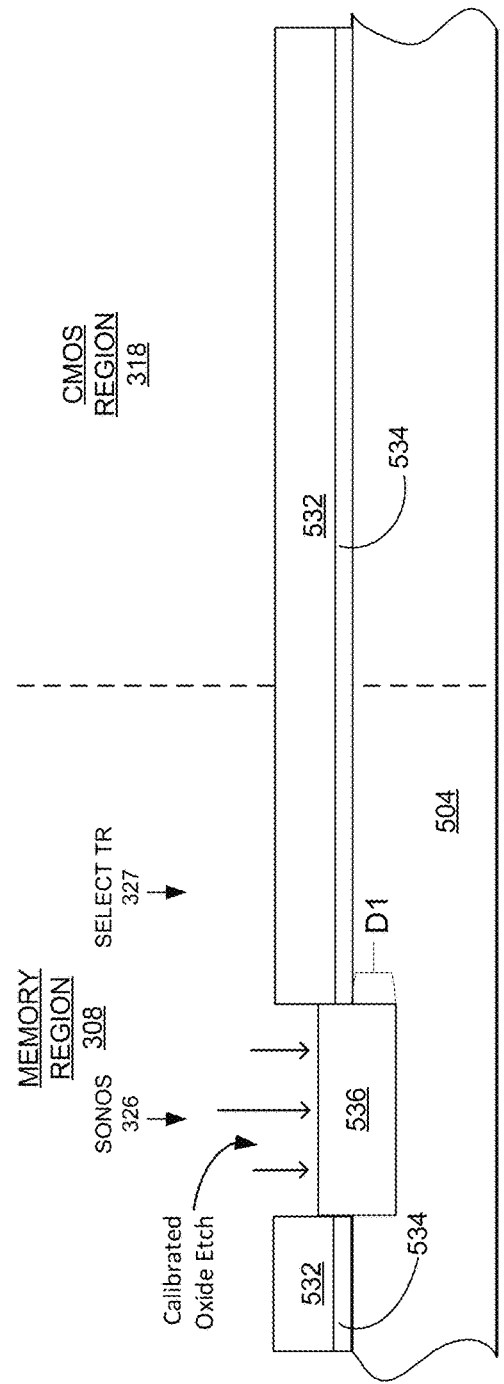

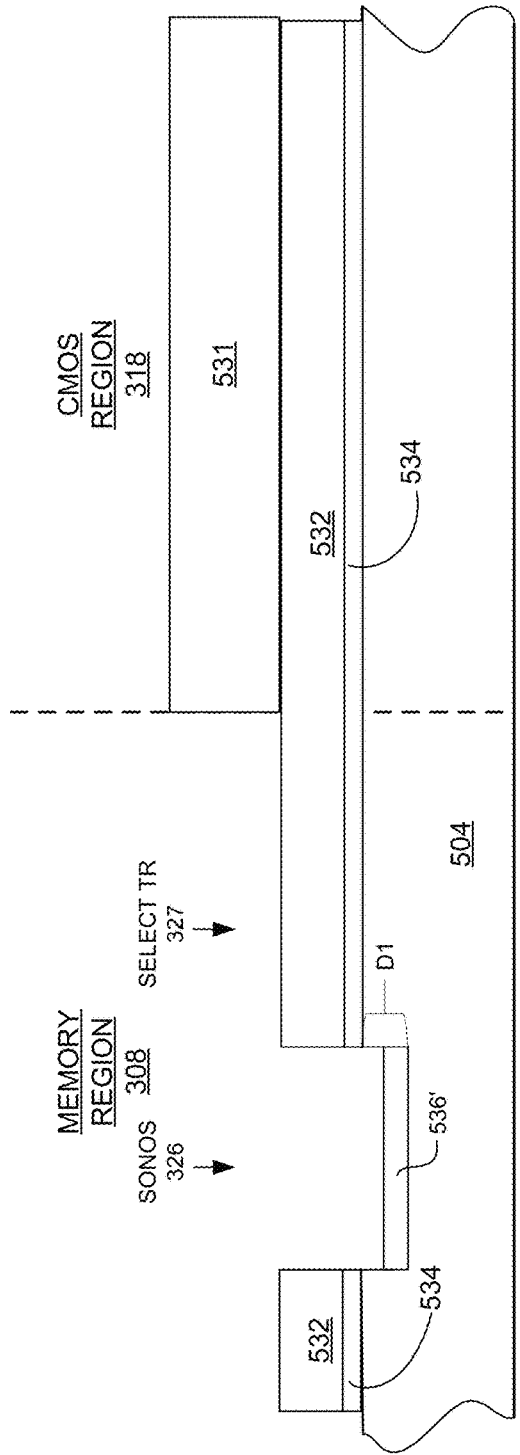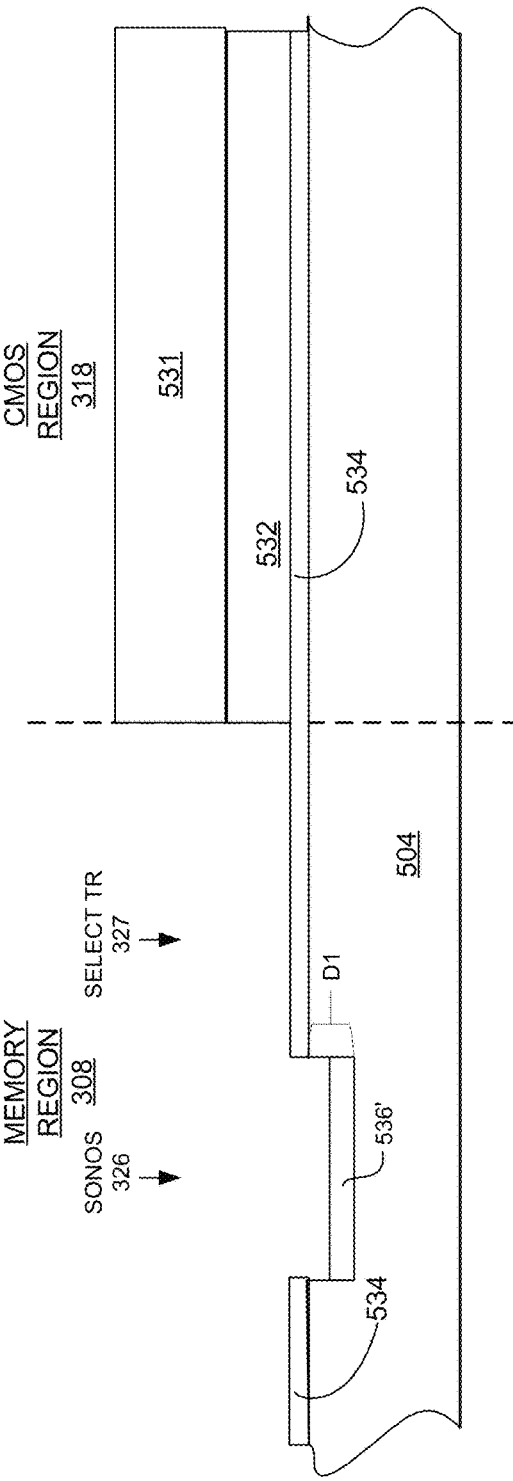

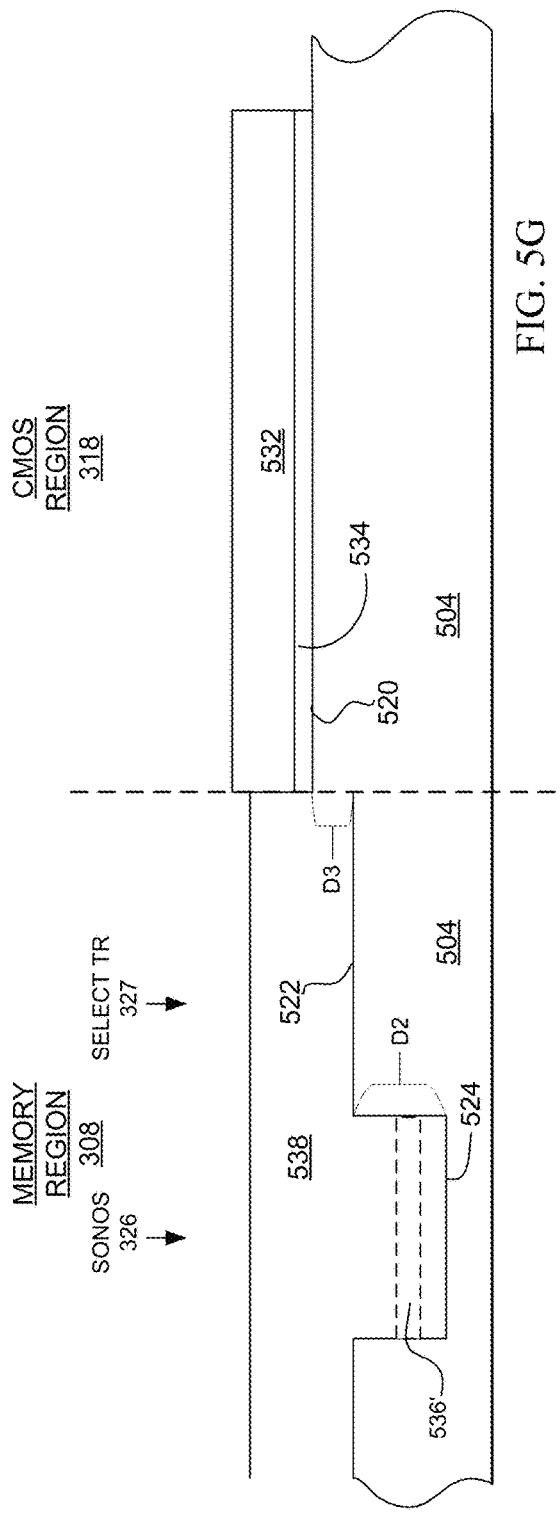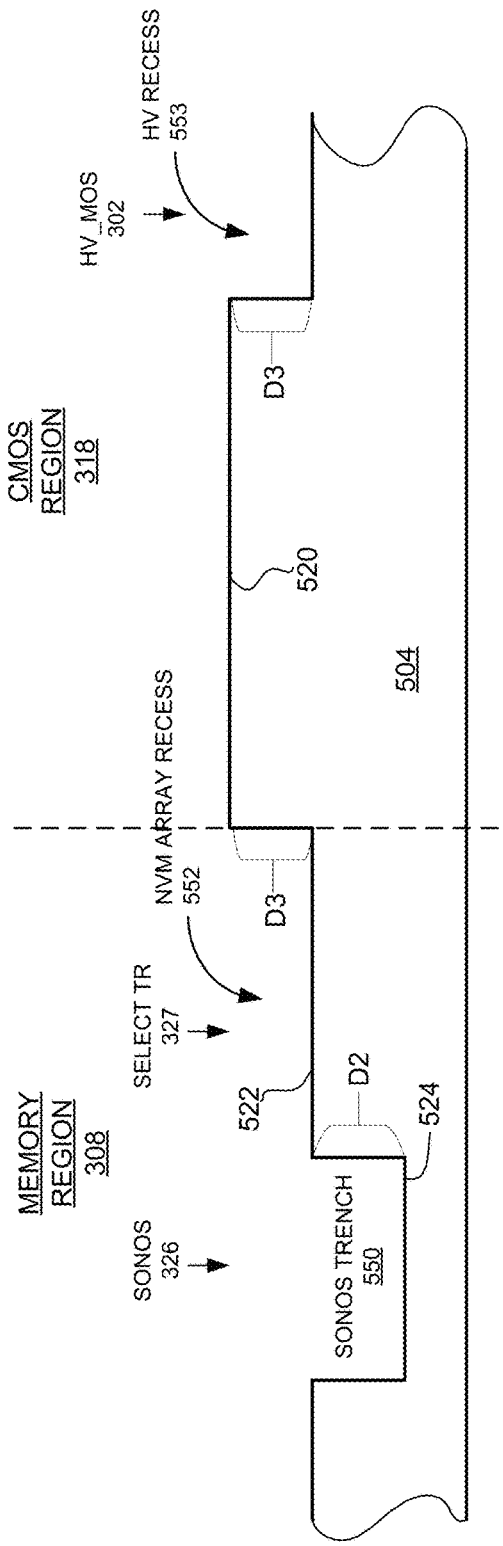

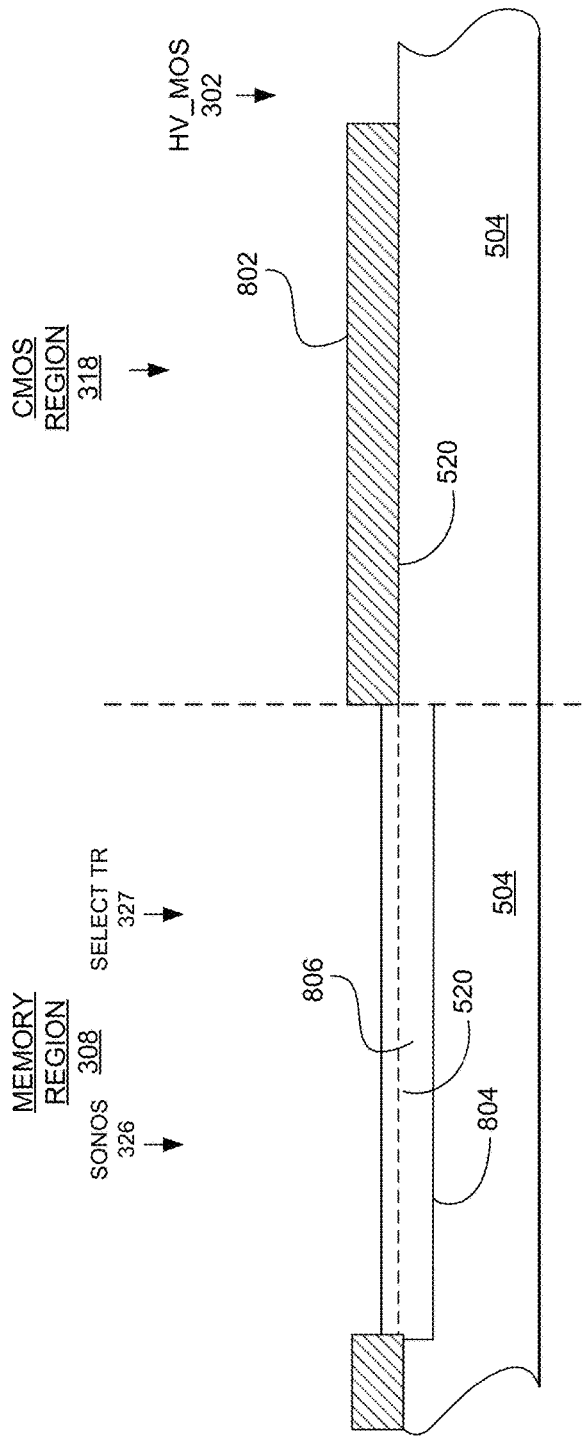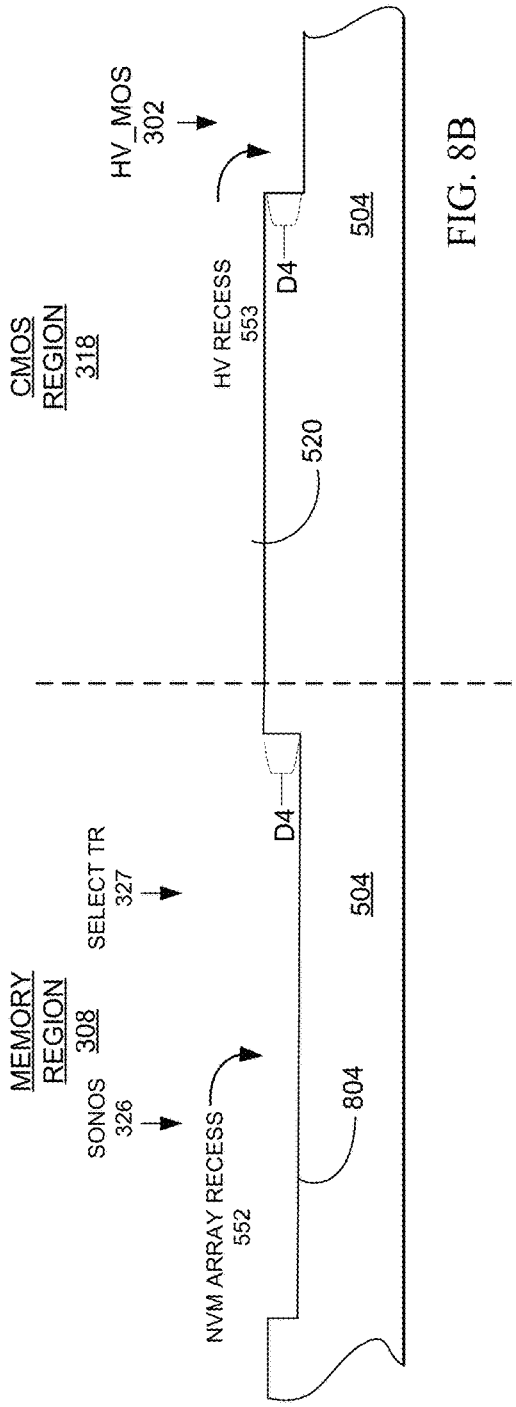

METHODS OF EQUALIZING GATE HEIGHTS IN EMBEDDED NON-VOLATILE MEMORY ON HKMG TECHNOLOGY

CROSS-REFERENCE TO RELATED APPLICATIONS

None.

TECHNICAL FIELD

The present disclosure relates generally to semiconductor devices, and more particularly to memory cells and methods of manufacturing thereof including an embedded or integrally formed charge-trapping gate stack and a select gate stack both having a high-K or hi-K dielectric (HK) and a metal gate (MG) into an existing HKMG complementary metal-oxide-semiconductor (CMOS) foundry logic technology.

BACKGROUND

Non-volatile memory (NVM) is widely used for storing data in computer systems, and typically includes a memory array with a large number of NVM cells arranged in rows and columns, or other configurations. For the past several decades, the scaling of features in integrated circuits has been a driving force behind an ever-growing semiconductor industry. Scaling to smaller and smaller features enables increased densities of functional units on the limited real estate of semiconductor chips. The drive for ever-more capacity, however, is not without issue. The necessity to optimize the performance of each device while scaling becomes increasingly significant.

In some embodiments, NVM cells may include at least a non-volatile element, such as charge trapping field-effect transistor (FET), floating gate transistor, that is programmed or erased by applying a voltage of the proper polarity, magnitude and duration between a control/memory gate and the substrate or drain/source regions. In some embodiments, semiconductor-oxide-nitride-oxide-semiconductor (SONOS) based memory arrays are utilized and operated as data storage devices wherein binary bit (0 and 1) or analog data, based on the SONOS cells' distinct $V_T$ or $I_D$ levels or values, are stored. Charge-trapping gate stack is typically fabricated using materials and processes that differ significantly from those of the baseline CMOS process flow, and which may detrimentally impact or be impacted by the fabrication of the MOS transistors. In particular, forming a gate oxide or dielectric of a MOS transistor may significantly degrade performance of a previously formed charge-trapping gate stack by altering a thickness or composition of the charge-trapping layer(s). In addition, this integration may also impact the baseline CMOS process flow, and generally require a substantial number of mask sets and process steps, which add to the expense of fabricating the devices and may reduce yield of working devices.

Besides, it may be important for the integrated fabrication process to be able to control the thickness of top or blocking dielectric of NVM transistors, for example, in order to meet requirements such as desirable threshold voltages Vts and/or equivalent oxide thickness (EOT) while satisfying gate oxide thickness (physical or electrical) targets of MOS transistors, especially if those MOS transistors are high voltage (HV) or input/output (I/O) transistors.

As technology nodes are getting smaller, for example at 22 nm and below, high-K metal gate (HKMG) stacks have become more important. HKMG stacks may switch using a thin high-K dielectric additionally or alternatively to the blocking silicon oxide or silicon oxynitride layer and a metal gate instead of a polysilicon gate. Among other benefits, HKMG stacks may reduce leakage and improve overall performance of MOS transistors, and data retention of SONOS transistors. Therefore, there are needs to incorporate SONOS into HKMG CMOS process flow. The introduction of metal gates to SONOS transistors may transform the device to metal-oxide-nitride-oxide-semiconductor (MONOS) or "HKMG SONOS". It will be the understanding that the two terms, viz. SONOS and MONOS are used interchangeably throughout this patent document.

It is, therefore, an object of the present invention to propose an improved fabrication process to form the ONO stacks in SONOS memory cells; and integrated such process into baseline HKMG CMOS process flow.

BRIEF DESCRIPTION OF THE DRAWINGS

The present invention will be understood more fully from the detailed description that follows and from the accompanying drawings and the appended claims provided below, where:

FIGS. 5A-5H are representative diagrams illustrating cross-sectional views of a portion of a 2T memory cell and CMOS devices during fabrication according to the process flow in FIG. 4;

FIGS. 8A-8B are representative diagrams illustrating cross-sectional views of a portion of a 2T memory cell and CMOS devices during fabrication according to the process flow in FIG. 7;

DETAILED DESCRIPTION

Figure 1:
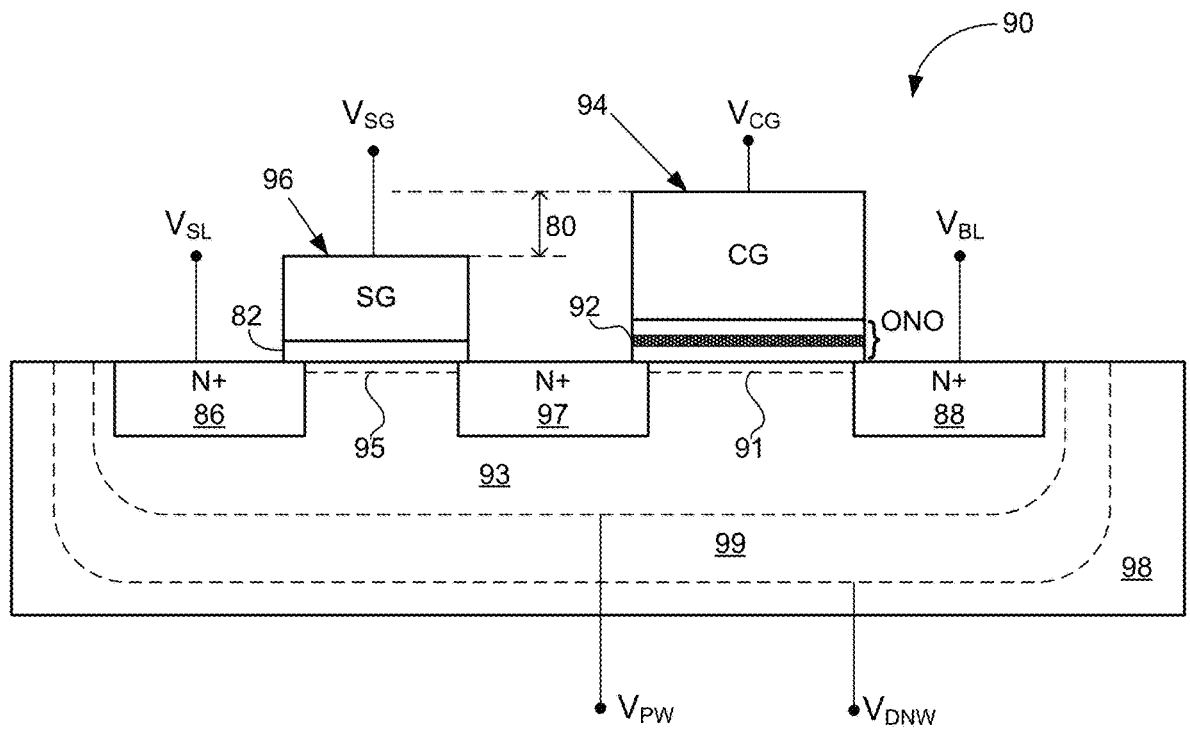
FIG. 1 is a block diagram illustrating a cross-sectional side view of a SONOS based non-volatile memory transistor or device.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a two-transistor (2T) memory cell including an embedded non-volatile memory (NVM) transistor and metal-oxide-semiconductor (MOS) transistor, both having a high-K metal gate (HKMG) stack, and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. Additionally, the relative position of one layer with respect to other layers is provided assuming operations deposit, modify and remove films relative to a starting substrate without consideration of the absolute orientation of the substrate.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

The NVM transistor may include memory transistors or devices implemented related to Silicon-Oxide-Nitride-Oxide-Silicon (SONOS), Metal-Oxide-Nitride-Oxide-Silicon (MONOS) or floating gate technology. An embodiment of a method for integrating or embedding NVM transistors into a standard or baseline HKMG CMOS process flow for fabricating one or more type of MOS transistors, which may include HV select gates, HV gates, Input/Output (I/O) gates, low voltage (LV) gates with high-K metal gates (HKMGs), will now be described in detail with reference to FIGS. 1 through 10G.

SUMMARY OF SUBJECT MATTER

According to one embodiment of a method of fabrication of a semiconductor device, the method may include the process flow of dividing a substrate into first and second regions, forming a first recess to a first depth in the first region, forming a non-volatile memory (NVM) transistor and a select transistor at least partly within the first recess, in which may further include forming a non-volatile (NV) dielectric stack in the first recess, wherein the NV dielectric stack includes a blocking oxide disposed over a charge-trapping layer and a tunnel oxide, performing at least one silicon oxide deposition process in an atomic layer deposition (ALD) tool to form a gate dielectric layer of the select transistor adjacent to the NV dielectric stack in the first recess, performing an oxide removal process step to thin out a thickness of the blocking oxide of the NV dielectric stack, forming a high-K dielectric layer overlying the blocking oxide and the gate dielectric layer respectively, forming a sacrificial polysilicon gate over the high-K dielectric layers of the NV dielectric stack and the gate dielectric layer respectively, replacing the sacrificial polysilicon gates with metal gates.

In one embodiment, the method in which the NVM transistor and the select transistor may be configured to form a two-transistor (2T) NVM cell.

In one embodiment, wherein forming the first recess may include the steps of patterning a photo-resist to expose the first region, performing an oxidation process, wherein the oxidation process consumes a top portion of the substrate in the first region to form a first recess oxide layer to the first depth within the substrate, and performing an oxide cleaning process to remove the first recess oxide layer completely in the first region.

In one embodiment, wherein the oxide removal process step of the NV dielectric stack may include the steps of patterning a photo-resist to expose the NV dielectric stack, performing an oxide cleaning process on the blocking oxide, and calibrating the oxide cleaning process to control the thickness of the blocking oxide.

In one embodiment, the gate dielectric layer formed by the at least one silicon oxide deposition process may be substantially deposited above a top surface of the substrate in the first recess.

In one embodiment, in which the elevation of top surfaces of the sacrificial polysilicon gates of the NVM transistor and the select transistor has a height difference of less than 50 Å.

In one embodiment, in which replacing the sacrificial polysilicon gates may further include the steps of forming a stress inducing silicon nitride layer and an interlevel dielectric layer (ILD) overlying the substrate in the first region, performing a first chemical-mechanical polishing (CMP) process until at least one of the sacrificial polysilicon gates of the NVM transistor and the select transistor is exposed, performing a polysilicon etch to remove the sacrificial polysilicon gates in the NVM transistor and the select transistor to create gate openings, forming a metal gate overlying each of the high-K dielectric layers, and performing a second CMP process to equalize gate heights of the NVM transistor and select transistor.

In one embodiment, in which the elevation of top surfaces of the metal gates of the NVM transistor and the select transistor is substantially coplanar.

In one embodiment, the fabrication method may further include the steps of forming an input/output (I/O) transistor, a low-voltage (LV) transistor, a high-voltage (HV) transistor outside of the first recess in the second region, wherein a gate dielectric layer of the HV transistor is thicker than a gate dielectric layer of the I/O transistor, the gate dielectric of the I/O transistor is thicker than a gate dielectric layer of the LV transistor, in which each of the HV, I/O, and LV transistors include a high-K metal gate, and wherein elevation of top surfaces of the high-K metal gates of the NVM and select transistors disposed within the first recess and top surfaces of the high-K metal gates of the HV, I/O, and LV transistors disposed outside the first recess is substantially coplanar.

In one embodiment, the fabrication method may further include the steps of forming a second recess to the first depth in the second region concurrently with the first recess, in which the select transistor and the HV transistor may have the same structural features, and the HV transistor may be formed within the second recess.

In one embodiment, the fabrication method may further include the steps of forming a second recess to a second depth within the first recess in the first region, and forming the NVM transistor within the second recess, in which the second depth is larger than the first depth and the select transistor is formed outside the second recess.

According to another embodiment, a method for fabricating a semiconductor device may include the process flow of dividing a substrate into first and second regions, forming a first recess to a first depth in the first region, forming a second recess to a second depth in the first recess, wherein the second depth is larger than the first depth, forming a non-volatile memory (NVM) transistor and a select transistor in the first recess, forming a non-volatile (NV) dielectric stack at least partly in the second recess, in which the NV dielectric stack includes a blocking oxide disposed over a charge-trapping layer and a tunnel oxide, and forming a gate dielectric layer of the select transistor adjacent to the NV dielectric stack and outside of the second recess, forming a high-voltage (HV) transistor, an input/output (I/O) transistor, and a low-voltage (LV) transistor, each comprising a gate dielectric layer, in the second region outside of the first recess, forming a hi-K dielectric layer overlying each of the NV dielectric stack and gate dielectric layer of the select, HV, I/O, and LV transistors respectively, forming sacrificial polysilicon gates overlying the hi-K dielectric layers, and replacing the sacrificial polysilicon gates with metal gates, in which the elevation of top surfaces of the metal gates of the NVM and select transistors in the first region and top surfaces of the metal gates of the HV, I/O, and LV transistors in the second region is substantially the same.

In one embodiment, the fabrication method may also include the steps of patterning a photo-resist to expose the first region, performing an oxidation process, wherein the oxidation process consumes a top portion of the substrate in the first region to form a first recess oxide layer to the first depth within the substrate, and performing an oxide cleaning process to remove the first recess oxide layer completely in the first region.

In one embodiment, in which forming the second recess further may include the steps of forming a recess nitride layer overlying a sacrificial oxide layer in the first region, patterning a photo-resist to expose an NVM area wherein the NVM transistor to be formed, removing the recess nitride layer in the NVM area, performing a first oxidation process in the NVM area, wherein the first oxidation process consumes a top portion of the substrate in the NVM area to form a second recess oxide layer within the substrate, removing the recess nitride layer in the first region, performing a second oxidation process in the first region, wherein the second oxidation process further grows the second recess oxide layer to the second depth in the substrate, and performing an oxide cleaning process to remove the second recess oxide layer completely in the NVM area.

In one embodiment, in which forming the gate dielectric layer of the select transistor may include the steps of performing at least one silicon oxide deposition process in an atomic layer deposition (ALD) tool to form the gate dielectric layer of the select transistor adjacent to the NV dielectric stack in the first recess and performing an oxide removal process step to reduce a thickness of the blocking oxide of the NV dielectric stack.

In one embodiment, in which replacing the sacrificial polysilicon gates may further include the steps of forming a stress inducing silicon nitride layer and an interlevel dielectric layer (ILD) overlying the substrate in the first region, performing a first chemical-mechanical polishing (CMP) process until at least one of the sacrificial polysilicon gates of the NVM transistor and the select transistor is exposed, performing a polysilicon etch to remove the sacrificial polysilicon gates in the NVM transistor and the select transistor to create gate openings, forming a metal gate overlying each of the high-K dielectric layer, and performing a second CMP process to equalize gate heights of the NVM transistor and select transistor.

According to yet another embodiment, a method of fabricating a semiconductor memory device may include the process flow of dividing a substrate into first and second regions, forming a first recess to a first depth in the first region, forming a second recess to a second depth in the first recess, in which the second depth is larger than the first depth, forming a third recess of the first depth in the second region, forming a non-volatile memory (NVM) transistor including a non-volatile (NV) dielectric stack in the second recess, in which the NV dielectric stack includes a blocking oxide disposed over a charge-trapping layer and a tunnel oxide, forming a select transistor adjacent to the NVM transistor including a select gate dielectric disposed in the first recess and outside the second recess, forming high-voltage (HV), input/output (I/O), and low-voltage (LV) transistors, each comprising a gate dielectric layer, in the second region outside the first recess, wherein the HV transistor is disposed within the third recess, forming a hi-K dielectric layer overlying each of the blocking oxide of the NVM transistor, the select gate dielectric, and the gate dielectric layers of the HV, I/O, and LV transistors, and forming a sacrificial polysilicon gate overlying each of the hi-K dielectric layers.

In one embodiment, the elevation of top surfaces of the sacrificial polysilicon gates of the NVM transistor and the select transistor in the first region, and top surfaces of the sacrificial polysilicon gates the HV, I/O, and LV transistors in the first and second regions has a height difference of less than 50 Å.

In one embodiment, the method may also include the step of replacing the sacrificial polysilicon gates with metal gates, in which the elevation of top surfaces of the metal gates of the NVM and select transistors in the first region and top surfaces of the high-K metal gates of the HV, I/O, and LV transistors in the second region is substantially the same.

DESCRIPTION OF EMBODIMENTS

Figure 2:
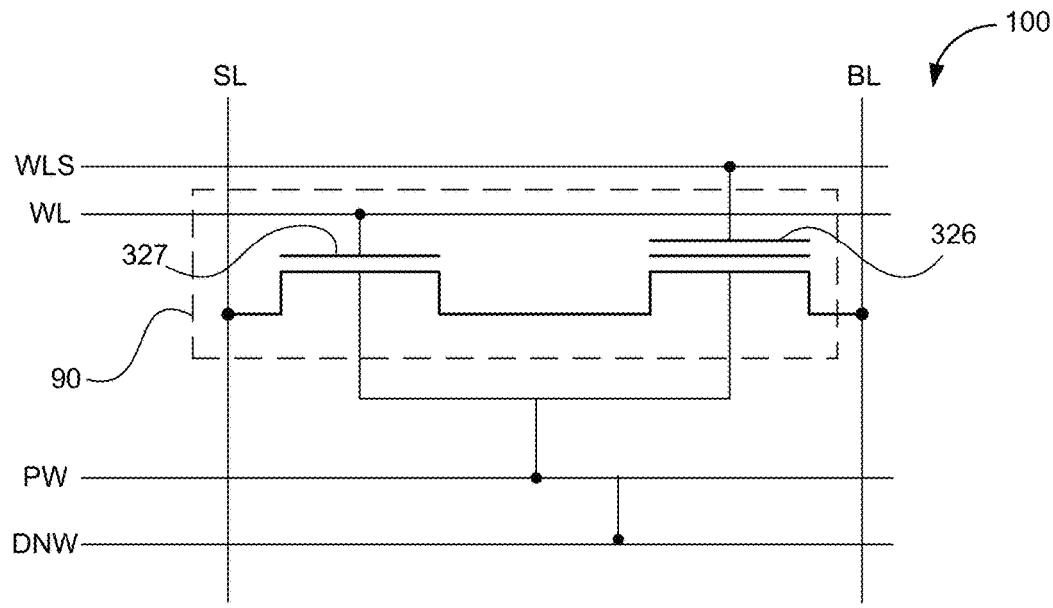
FIG. 2 illustrates a corresponding schematic diagram of the SONOS based non-volatile memory transistor or device depicted in FIG. 1.

FIG. 1 is a block diagram illustrating a cross-sectional side view of a non-volatile memory cell, and its corresponding schematic diagram is depicted in FIG. 2. A non-volatile memory (NVM) array or device may include NVM cells with a non-volatile memory transistor or device implemented using Silicon (Semiconductor)-Oxide-Nitride-Oxide-Silicon (Semiconductor) (SONOS) or floating gate technology, and a field-effect transistor (FET) disposed adjacent or coupled to one another.

In one embodiment, illustrated in FIG. 1, the non-volatile memory transistor is a SONOS-type charge trapping non-volatile memory transistor. Referring to FIG. 1, NVM cell 90 includes a control gate (CG) or memory gate (MG) stack of NV transistor 94 formed over substrate 98. NVM cell 90 further includes source 97/drain 88 regions formed in substrate 98, or optionally within positive well (PW) 93 in substrate 98, on either side of NV transistor 94. PW 93 may be at least partly encapsulated within deep negative well (DNW) 99. In one embodiment, source/drain regions 88 and 97 are connected by channel region 91 underneath NV transistor 94. NV transistor 94 may include an oxide tunnel dielectric layer, a nitride or oxynitride charge-trapping layer 92, an oxide top or blocking layer, forming the ONO stack. In one embodiment, charge-trapping layer 92 may be multiple layered and traps charges injected from substrate 98 by Fowler-Nordheim (FN) tunneling. Threshold voltage ($V_T$) and drain current ($I_D$) values of NV transistor 94 may change at least partly due to the amount of trapped charges. In one embodiment, a high K dielectric layer may form at least a portion of the blocking layer. A poly-silicon (poly) or metal gate layer disposed overlying the ONO layer, which may serve as a control gate (CG) or memory gate (MG). As best shown in FIG. 1, NVM cell 90 further includes a FET or select transistor % disposed adjacent to NV transistor 94. In one embodiment, FET % includes a metal or polysilicon select gate (SG) disposed overlying an oxide or high-K dielectric gate dielectric layer. FET % further includes gate oxide layer 82, source/drain regions 86 and 97 formed in substrate 98, or optionally within well 93 in substrate 98, on either side of FET %. As best shown in FIG. 1, FET % and NV transistor 94 may share source/drain region 97 disposed in-between, or referred to as internal node 97. SG is appropriately biased $V_{SG}$ to open or close the channel 95 underneath FET %. NVM cell 90, as illustrated in FIG. 1, is considered having a two-transistor (2T) architecture, wherein NV transistor 94 and FET 96 may be considered the memory or NVM transistor and the select or pass transistor, respectively throughout this patent document. In one embodiment, select transistor % may have a relatively thinner gate oxide layer 82, in an approximate range of 50 Å 150 Å and operating in an approximate voltage range of 1.8 V-5.1 V. In embodiments. NV transistor 94 may have up to approximately 120-150 Å or more in height. Due to the height difference between the ONO layer of the NV transistor 94 and the oxide layer 82, there may be a step height difference 80 between the two transistors 94 and %. As will be illustrated hereafter, step height difference 80 among different transistors, such as NV transistor 94 and FET %, may pose practical difficulties during metal gate fabrication in a HKMG process flow. In embodiments, the present disclosure is directed to equalize gate heights of NV transistor 94 and FET %, or to minimize the step height difference 80 between them. As will be shown and described in later sections, the high step height difference 80, especially when it exceeds approximately 50 Å, may lead to undesirable silicon nitride residue on top of the select and HV_MOS transistors or other MOS transistors during a chemical mechanical planarization (CMP) process of the HKMG fabrication.

In another embodiment, the NV transistor 94 may be a floating-gate MOS field-effect transistor (FGMOS) or device. Generally, FGMOS is similar in structure to the SONOS based NV transistor 94 described above, differing primarily in that a FGMOS includes a poly-silicon (poly) floating gate, which is capacitively coupled to inputs of the device, rather than a nitride or oxynitride charge-trapping layer 92. Thus, the FGMOS device can be described with reference to FIGS. 1, and operated in a similar manner.

FIG. 2 is a schematic diagram illustrating a portion of an NVM array 100 in accordance with one embodiment of the subject matter. In one embodiment, illustrated in FIG. 2, memory cells 90 may have a 2T architecture and each includes, in addition to a non-volatile memory transistor, a pass or select transistor, for example, a HV MOSFET sharing a common substrate connection, or internal node, with the memory transistor. In one embodiment, an NVM array 100 includes NVM cells 90, having SONOS 326 and select transistors 327, arranged in N rows or page (horizontal) and M columns (vertical), connected with word lines, bit lines, and other connections. The NVM array 100 may be embedded in another semiconductor device or system, such as micro-controllers that includes MOSFETs and other semiconductor devices.

Figure 3:
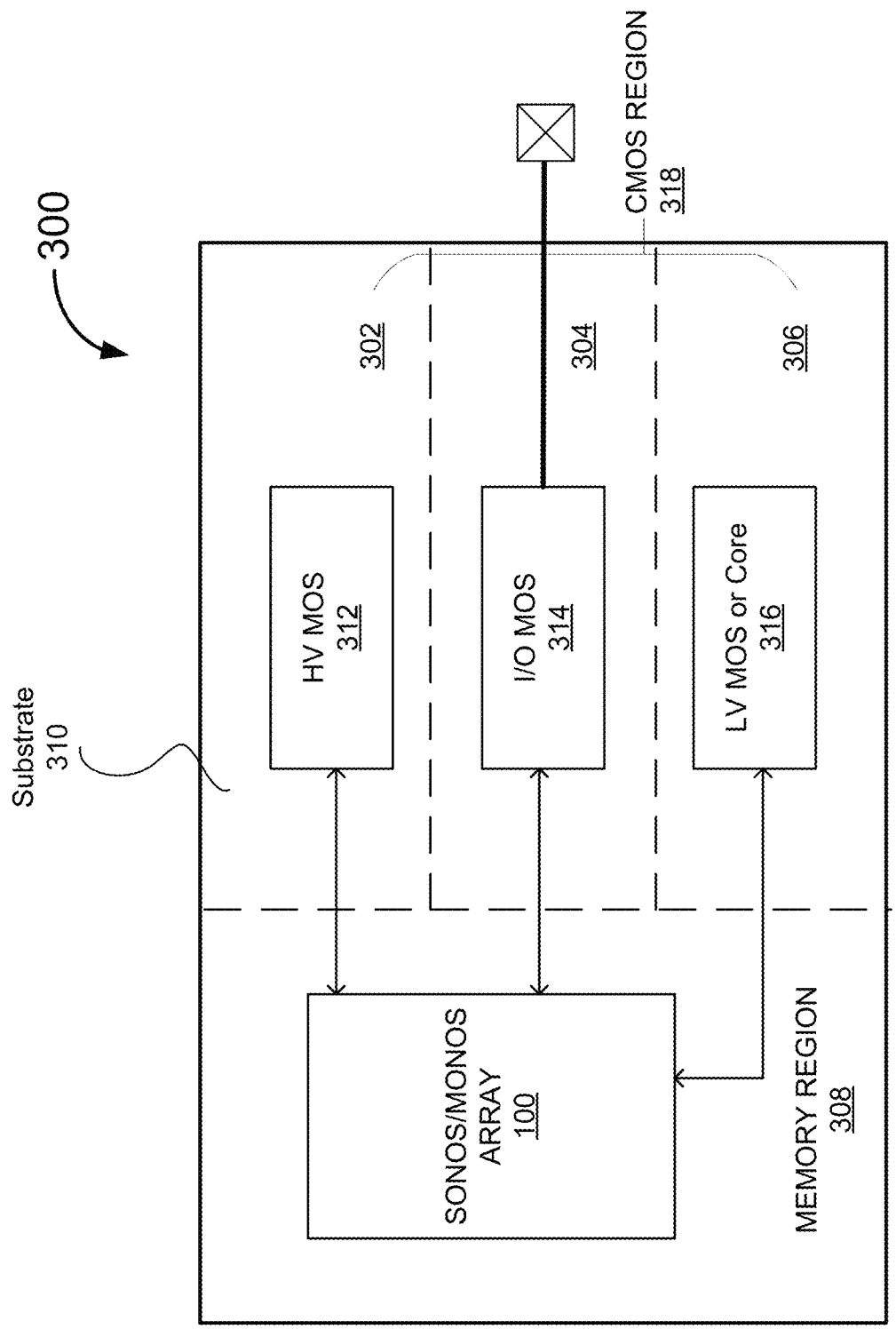
FIG. 3 is a representative block diagram illustrating one embodiment of embedded SONOS or MONOS based NVM device 300 according to the present disclosure.

FIG. 3 is a representative block diagram illustrating embedded SONOS or MONOS based NVM device 300, as fabricated in FIGS. 4,5A-5H, 7, 8A-8B, 9A-9B, and 10A-10G. In one embodiment, embedded SONOS or MONOS based NVM device 300 is formed in a single semiconductor die or substrate 310. The semiconductor die or substrate 310 is at least divided into the first or memory region 308 for the embedded memory, such as NVM array 100 and the second or CMOS or logic regions 318 for HV MOS transistors 312, I/O MOS transistors 314, and LV MOS transistors 316, respectively. In some embodiments, there may be MOS transistors in the first region 308 as some NVM memory arrays may include HV select transistors. For example, a two-transistor (2T-memory gate/select gate) configuration memory array having HV transistors as the select transistors. The second region 318 may be further divided into HV_MOS area 302, I/O_MOS area 304, and LV_MOS or Core area 306. It will be the understanding that embedded SONOS or MONOS based NVM device 300 may include other devices, such as processors, power circuits, etc. In various embodiments, one or more of the first and second regions 308 and 318 may be overlapping spatially, and the HV_MOS area 302, I/O_MOS area 304, and LV_MOS or core area 306 may be overlapping. In will be the understanding that embodiment illustrated in FIG. 3 is only exemplary, and one or more of the first region 308 and the HV_MOS area 302, I/O_MOS area 304, and LV_MOS or core area 306 may be located in any location of single substrate 300 or multiple substrates, and may be made up of various different regions.

In one embodiment, HV_MOS 312 and select transistors in SONOS/MONOS array may have the same or a similar structural features (e.g. gate oxide thickness) and be provided with a high voltage in a range of 4.5 V-12 V or other voltages in order to program and/or erase NVM transistors in NVM array 100. I/O_MOS 314 may be coupled to I/O interface and provided with an operation voltage in a range of 1.6 V-3.6 V or other voltages. LV_MOS or core MOS 312 may be provided with an operation voltage in a range of 0.8 V-1.4 V or other voltages for various operations and connections.

In this disclosure, processes to embed an Oxide-Nitride-Oxide (ONO) or ONONO charge trapping stack with single-layer or bi-layer nitride into a CMOS process that includes HKMGs and/or a thick gate oxide for the select gate and HV devices are introduced and described. In embodiments, the ONO or ONONO charge trapping stack is thicker than gate oxide layers of other CMOS devices including gate oxide for the select gate and HV devices. The gate height difference may cause problems during CMP process of interlayer dielectric materials, such as nitride, before dummy or sacrificial polysilicon gate removal. The residual nitride cap over select gates may act as a mask during the polysilicon removal process. The residual polysilicon in select gates will randomly pose serious negative impact on select gates' operation and the overall yield. Therefore, it is beneficial to equalize gate heights or minimize gate height difference or equalize the elevation of top surfaces of NVM devices and CMOS devices.

Figure 4:
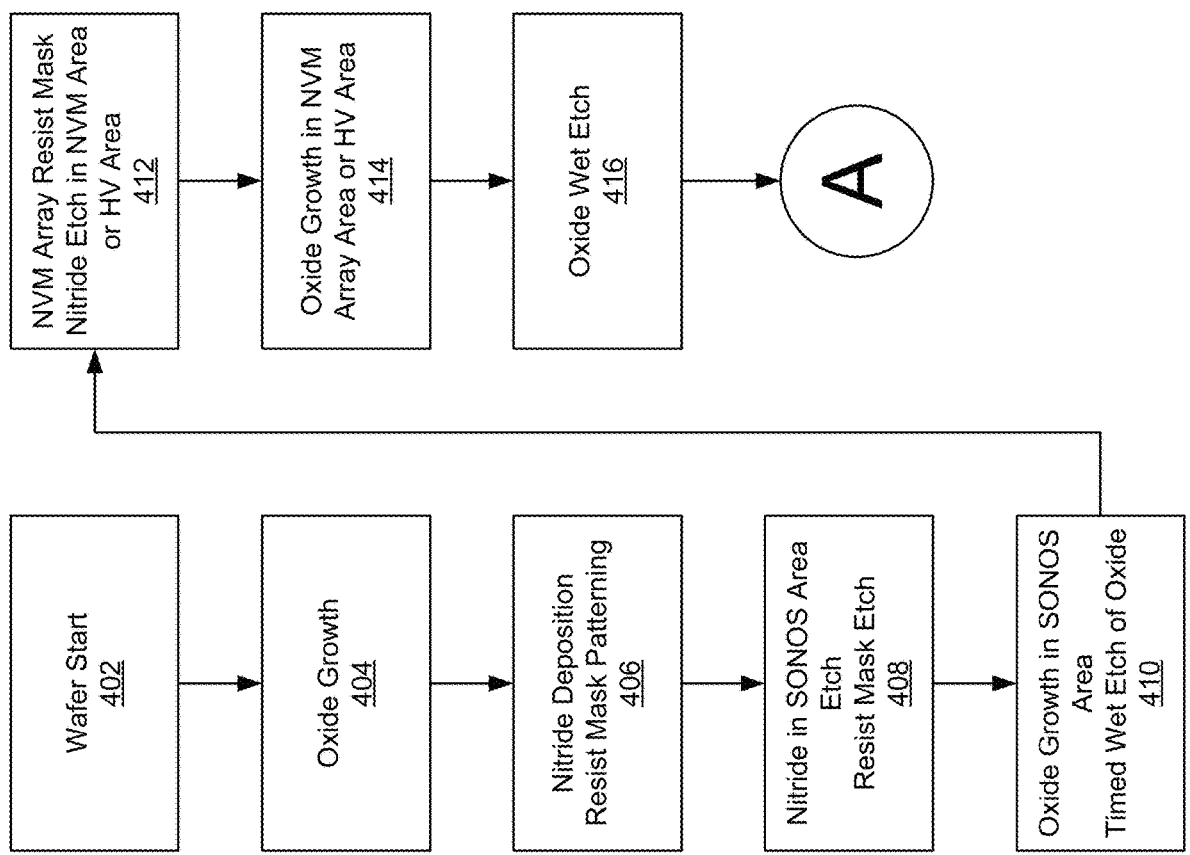
FIG. 4 is a flowchart illustrating an embodiment of a method for fabricating embedded SONOS based NVM transistor and MOS transistor (two transistor (2T)) memory cells and CMOS devices.

FIG. 4 is representative flowchart illustrating an embodiment of a method of fabrication of a SONOS based non-volatile memory cell having HKMGs, such as NVM cell 90 including NV transistor 94 and FET %, as best shown in FIG. 1, according to an embodiment of the present disclosure. Referring to FIG. 4 and FIG. 5A, the process begins with an optional pre-clean step of substrate 504. In one embodiment, substrate 504 may be divided into one or multiple memory or first region(s) 308 and CMOS or second region(s) 318. The substrate 504 may be a bulk substrate composed of any single crystal material suitable for semiconductor device fabrication, or may include a top epitaxial layer of a suitable material formed on a substrate. In one embodiment, suitable materials for substrate 504 include, but are not limited to, silicon, germanium, silicon-germanium or a Group III-V compound semiconductor material. In some embodiments, there may be MOS transistors, such as HV_MOS transistors 312, in the first region 308. This is because certain NVM memory arrays may include HV_MOS transistors as select transistors, e.g. in a two-transistor (2T) memory array, such as NVM cell 90 in FIG. 1. In one embodiment, at the beginning of the fabrication method in FIG. 4, the top surface of substrate 504 may be co-planar in memory and CMOS regions 308 and 318.

Referring to FIG. 5A, oxide layer 534 may be formed over both the memory region 308 and the CMOS region 318 in the substrate 504. In embodiments, oxide layer 534 may be formed by a rapid thermal dry oxidation (RTO) process, a conventional or furnace oxidation process, a rapid and radical wet oxidation process such as in-situ steam generation (ISSG) a chemical vapor deposition process (CVD), or other oxide forming processes known in the art, or a combination thereof. After that, nitride layer 532 may be formed overlying or directly over oxide layer 534. In embodiments, nitride layer 532 may be deposited by chemical vapor deposition (CVD) or atomic layer deposition (ALD) and is composed of a dielectric layer which may include, but is not limited to silicon oxy-nitride or silicon nitride. In one embodiment, oxide layer 534 may be formed to an approximate range of 100 Å to 200 Å in thickness and nitride layer 532 to an approximate range of 500 Å to 1,000 Å.

Next, referring to FIGS. 4 and 5B, a nitride etch is performed in at least the NVM transistor or SONOS 326 area, in step 408. As best shown in FIG. 5B, a patterned mask layer 530 may be formed and patterned on or overlying substrate 504. The patterned mask layer 530 may open or expose at least the NVM transistor 326 area in the first region 308 for the subsequent nitride layer 532 or oxide layer 534 etch process(es). The patterned mask layer 530 may include a photoresist layer patterned using standard lithographic techniques, a hard mask layer or other techniques known in the art. In one embodiment, nitride layer 532 in NVM transistor 326 area is then removed using a plasma etch process or similar etch processes known in the art. The plasma etch process may stop at oxide layer 534, as best shown in FIG. 5C. Alternatively, the plasma etch process may stop at a top surface of substrate 504 in the NVM transistor 326 area such that oxide layer 534 is also removed.

Referring to FIG. 5D, patterned mask layer 530 may be removed overlying the substrate 504. In one embodiment, patterned mask layer 530 is completely removed from both memory region 308 and CMOS region 318. Photoresist material in patterned mask layer 530 may be ashed or stripped using oxygen plasma. Alternatively, it may be removed using a wet or dry etch process.

Referring to FIGS. 4 and 5D, NVM oxide layer 536 is grown or formed in NVM transistor 326 area, in step 410. In one embodiment, NVM oxide layer 536 is formed using RTO, furnace oxidation, radical oxidation, or other oxidation processes that uses or consumes substrate 504 as at least one of the silicon sources. Since silicon from substrate 504 is required for or otherwise consumed during formation of NVM oxide layer 536, NVM oxide layer 536 may grow both above, and below or otherwise within substrate 504 in NVM transistor 326 area to an approximate thickness of 100 Å to 200 Å, as best shown in FIG. 5D. NVM oxide layer 536 may be grown to D1 depth underneath top surfaces of substrate 504 in other areas/regions. In one embodiment, areas other than NVM transistor 326 area including CMOS region 318 and select transistor 327 area, are protected by at least nitride layer 532, there will be none or very little oxide being grown in those areas. Referring to FIG. 5D, an oxide preclean process is performed to thin or etch down NVM oxide layer 536. The NVM oxide preclean may involve, for example a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. In one embodiment, the wet clean process is calibrated or time controlled such that a pre-determined thickness of NVM oxide layer 536', as best shown in FIG. 5E, to protect substrate 504 surface in the NVM transistor 326 area during a plasma etch process in subsequent step(s).

Next, referring to FIGS. 4 and 5E, NVM array resist mask is formed over CMOS region 318. In the embodiment, previously described in step 410 and FIG. 5D, that patterned mask layer 530 is completely removed from both memory region 308 and CMOS region 318, a memory mask layer 531 may be formed and patterned on or overlying substrate 504. In one embodiment, memory mask layer 531 may open or expose at least the memory region 308 for the subsequent nitride layer 532 removal process (step 412). The memory mask layer 531 may include a photoresist layer patterned using standard lithographic techniques, a hard mask layer or other techniques known in the art. In one embodiment, nitride layer 532 is then removed completely in memory region 308, as best shown in FIG. 5E. Nitride layer 532 may be removed by a dry or plasma enhanced etch process or a selective wet etch process using a phosphoric acid solution in water, or other etching methods known in the art. In one embodiment, the nitride removal process may stop at oxide layer 534 and NVM oxide layer 536' in memory region 308, as best shown in FIG. 5F. In one embodiment, nitride layer 532 in CMOS region 318 remains intact as it is protected by memory mask layer 531.

Next, memory mask layer 531 may be removed completely or partially overlying substrate 504 in CMOS region 318. Photoresist material in patterned mask layer 530 may be ashed or stripped using oxygen plasma. Alternatively, it may be removed using a wet or dry etch process, or other removal processes known and practiced by one having ordinary skill in the art.

Referring to FIGS. 4 and 5G, NVM recess oxide layer 538 is formed in memory region 308, in step 414. In one embodiment, NVM recess oxide layer 538 is formed using RTO, furnace oxidation, radical oxidation, or other oxidation processes that uses or consumes substrate 504 as at least one of the silicon sources. Since silicon from substrate 504 is consumed for formation of NVM recess oxide layer 538, it may grow both above, and below or otherwise within substrate 504 in both SONOS transistor 326 area and select transistor 327 area, as best shown in FIG. 5G. In one embodiment, in SONOS transistor 326 area, during the oxidation performed in step 414, previously formed NVM oxide layer 536' may further grow deeper to depth D2 within substrate 504. In select transistor 327 area, NVM recess oxide layer 538 may also grow within substrate 504 to depth D3. As best shown in FIG. 5G, CMOS region 318 is protected by nitride layer 532 from the oxidation process in step 414, such that no or minimal oxide will be grown from oxide layer 534 or formed therein. Consequently, elevation of top surface 520 of substrate 504 in CMOS region 318 may remain substantially unchanged.

Then, nitride layer 532 remained in CMOS region 318 may be removed by a dry or plasma enhanced etch process or a selective wet etch process using a phosphoric acid solution in water, or other etching methods known in the art. In one embodiment, the nitride removal process may stop at oxide layer 534 in CMOS region 318.

Referring to FIGS. 4 and 5H, oxide layers are removed from both memory region 308 and CMOS region 318 overlying substrate 504, in step 416. As best shown in FIG. 5H, oxide layer 534 in CMOS region 318 and NVM recess oxide layer 536 in memory region 308 are removed from surfaces of substrate 504. In one embodiment, oxide layers 534 and 538 may be removed with a plasma etch process or a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. After the oxide removal, as best shown in FIG. 5H, NVM array recess 552 will be created in memory region 308, in which NVM transistor 326 and select transistor 327 will be fabricated therein. In one embodiment, bottom surface 522 of NVM array recess 552 is at a depth D3 compared to top surface 520 of substrate 504 in CMOS region 318. A SONOS trench or recess 550 is also created in SONOS transistor 326 area in which bottom surface 524 of SONOS trench 550 sits at depth D2, in an approximate range of 30 Å to 60 Å, compared to the bottom surface 522 of NVM array recess 552. In one embodiment, NVM transistors such as NVM transistor 94 in FIG. 1 are formed at least partly within SONOS trench 550 whereas select transistors such as select transistors % are formed at least partly within NVM array recess 552. In other embodiments, HV_MOS 302 that may have similar structural features and dimension to select transistors % may also be formed within a HV recess area 553 formed in CMOS region 318. In one embodiment, HV recess area 553 may be formed in a similar way to NVM array recess 522 in memory region 308, as previously shown and described in FIGS. 5D-5G.

Figure 6:
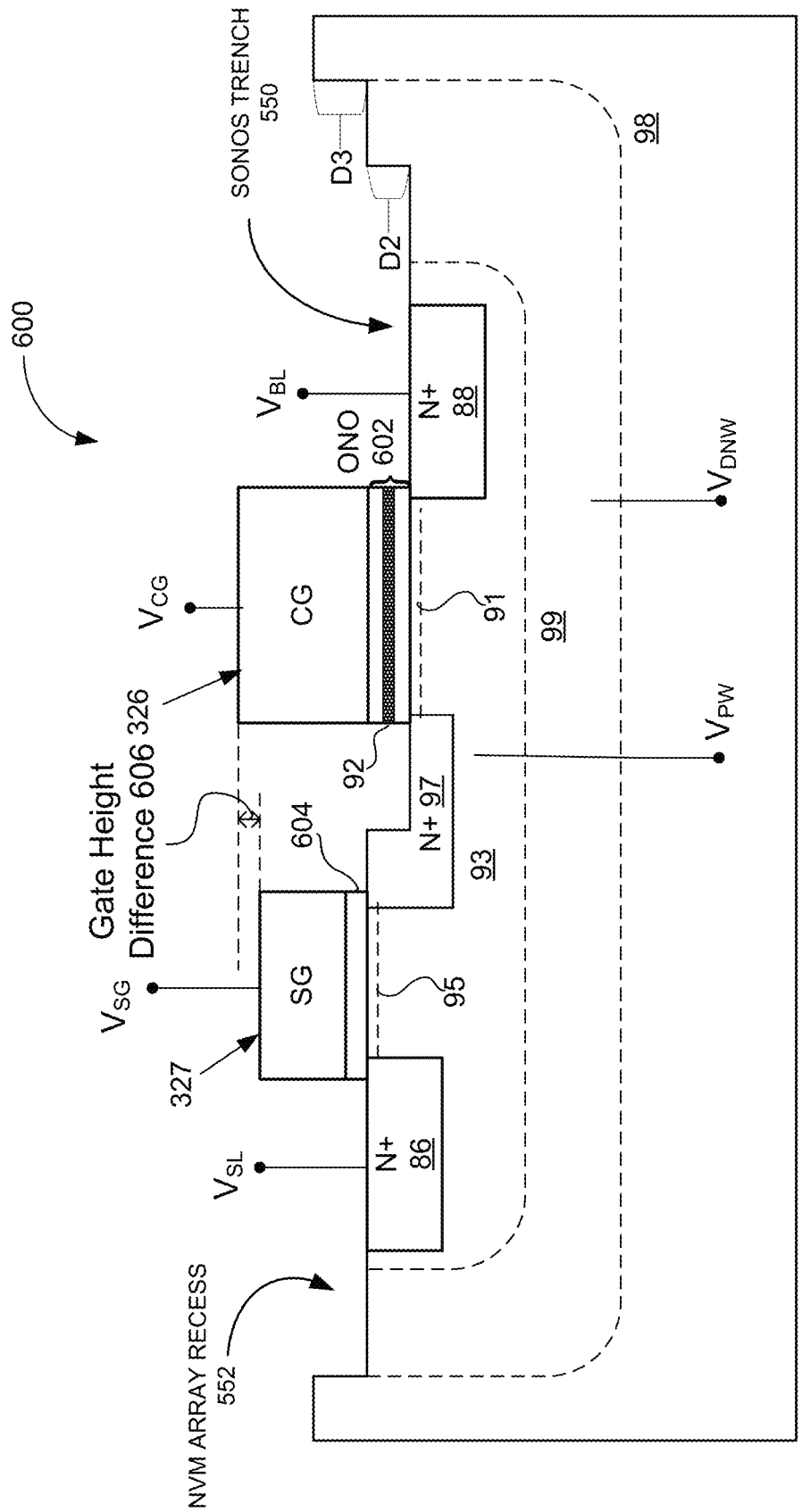
FIG. 6 is a block diagram illustrating a cross-sectional side view of a SONOS based non-volatile memory transistor or device formed in recess(es) according to the present disclosure.

FIG. 6 is a representative diagram illustrating NVM cell 600 formed in NVM array recess 552. In embodiments, NVM array recess 552 may be formed according to fabrication process as illustrated in FIGS. 4 and 5A-5H or other similar processes practiced in the art. Referring to FIG. 6, NVM cell 60) may be a 2T memory cell having a similar structure to NVM cell 90 as illustrated in FIG. 1, that includes a control gate (CG) or memory gate (MG) stack of NVM transistor 326 formed at least partially within SONOS trench 550 over substrate 504 and select transistor 327 disposed adjacent to NVM transistor 326 formed at least partially within NVM array recess 552. As previously explained, due to the height or thickness difference between the ONO layer 602 of the NVM transistor 326 and the relatively thinner gate dielectric layer 604 of select transistor 327, there may be a step height difference of up to 150 Å between the two transistors 326 and 327, as best shown in FIG. 1. In one embodiment, forming NVM transistor 326 in SONOS trench 550 that has a lower elevation than NVM array recess 552 may offset the height difference between the two transistors 326 and 327. In one embodiment, by controlling depth D3 and/or D2, gate height difference 606 may be eliminated or at least minimized within an operationally acceptable range of less than approximately 50 Å for the subsequent HKMG process flow. In embodiments, depth D3 and D2 may be manipulated by calibrating or tailoring operational parameters of the oxidation processes as elaborated in FIGS. 4, 5D, and 5G.

Figure 7:
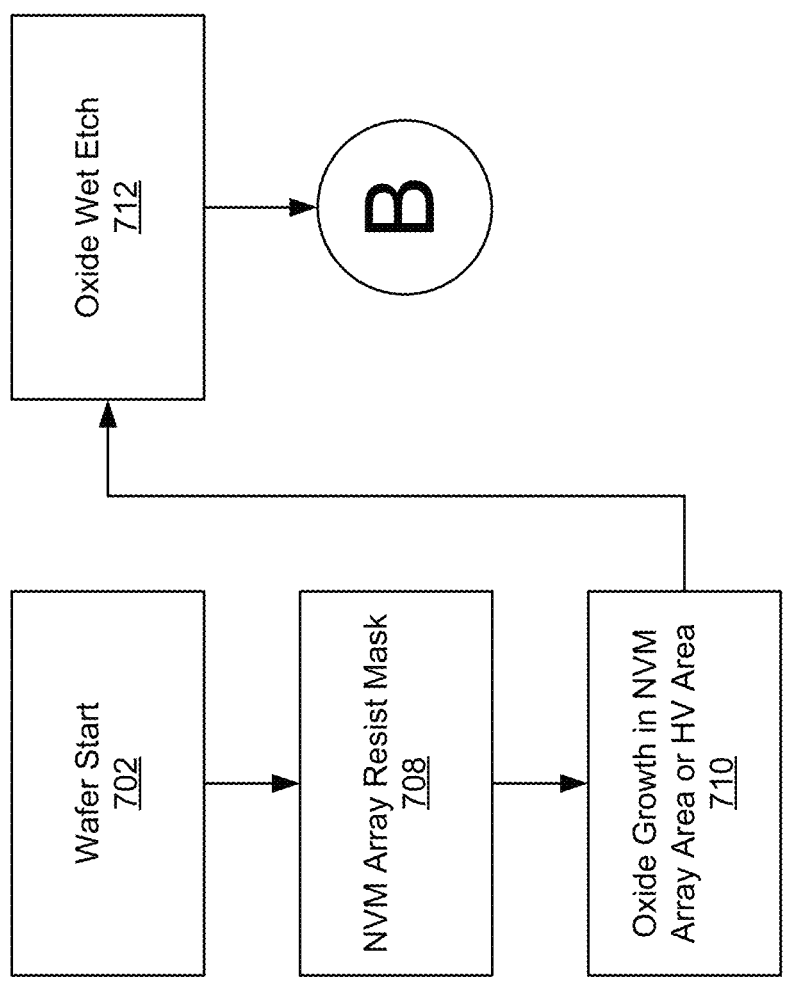
FIG. 7 is a flowchart illustrating an embodiment of a method for fabricating embedded SONOS based NVM transistor and MOS transistor (two transistor (2T)) memory cells and CMOS devices.

FIG. 7 is representative flowchart illustrating a method of fabrication of a SONOS based non-volatile memory cell having HKMGs, such as NVM cell 600 including NVM transistor 326 and select transistor 327, as best shown in FIG. 6, according to another embodiment of the present disclosure. Referring to FIGS. 7 and 8A. NVM array resist mask is formed over CMOS region 318 (step 708). Mask layer 802 may be formed and patterned on or overlying substrate 504. In one embodiment, mask layer 802 may open or expose at least the memory region 308 for the subsequent oxide growth process (step 710). In another embodiment, memory mask layer 802 may additionally open or expose at least HV_MOS area 302 in CMOS region 318. The mask layer 802 may include a photoresist layer patterned using standard lithographic techniques, a hard mask layer or other techniques known in the art. Next, NVM recess oxide layer 806 is formed in memory region 308, in step 710. In one embodiment, recess oxide layer 806 is formed in at least memory region 308, or additionally in HV_MOS area 302, using RTO, furnace oxidation, radical oxidation, or other oxidation processes that uses or consumes substrate 504 as at least one of the silicon sources. Since silicon from substrate 504 is consumed for formation of recess oxide layer 806, it may grow both above, and below or otherwise within substrate 504 in both SONOS transistor 326 area and select transistor 327 area to an approximate thickness of 100 Å to 200 Å, as best shown in FIG. 8A. In one embodiment, recess oxide layer 806 may grow within substrate 504 to depth D4. In one embodiment, CMOS region 318 (other than possibly HV_MOS area 302) is protected by mask layer 802 from the oxidation process in step 710, such that no or minimal oxide will be grown therein. Consequently, elevation of top surface 520 of substrate 504 may remain substantially unchanged in CMOS region 318. In another embodiment, HV_MOS area 302 that is not protected by mask layer 802 may also form recess oxide layer 806 to depth D4 therein.

Next, mask layer 802 may be removed completely or partially overlying substrate 504 in CMOS region 318. Photoresist material in patterned mask layer 802 may be ashed or stripped using oxygen plasma. Alternatively, it may be removed using a wet or dry etch process, or other removal processes known and practiced by one having ordinary skill in the art.

Referring to FIGS. 7 and 8B, recess oxide layers 806 are removed from both memory region 308 and CMOS region 318 overlying substrate 504, in step 712. As best shown in FIG. 8B, recess oxide layer(s) 806 in memory region 308 or CMOS region 318 is removed from surfaces of substrate 504. In one embodiment, recess oxide layer 806 may be removed with a plasma etch process or a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. After the oxide removal, as best shown in FIG. 8B, an NVM array recess 552 will be created in memory region 308, in which both NVM transistor 326 and select transistor 327 will be fabricated thereon. Additionally, a similar HV recess 553 have the depth D4 may also be created in CMOS region 318. In one embodiment, bottom surface 804 of NVM array recess 552 or HV recess 553 is at a depth D4 compared to top surface 520 of substrate 504 in CMOS region 318. In embodiments, depth D4 may offset height difference between NVM transistor 326, select transistor 327, or HV_MOS 312 formed within recess(es) to I/O_MOS 314 and LV_MOS 316 formed outside of recess (es) in CMOS region 318.

Figure 9A:
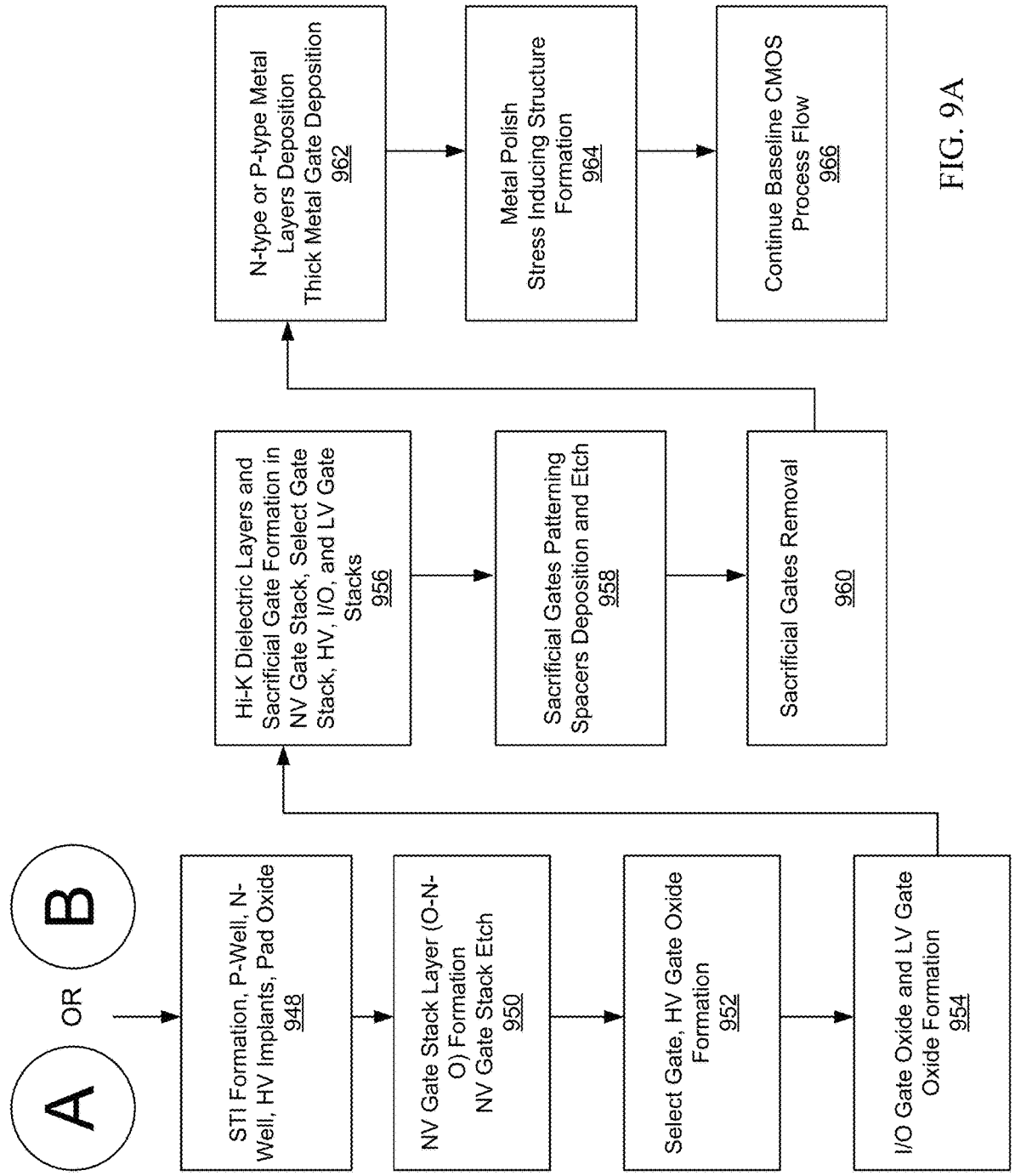
FIG. 9A is a flowchart illustrating an embodiment of a method for fabricating embedded SONOS based NVM transistor and MOS transistor (two transistor (2T)) memory cells and CMOS devices.

FIG. 9A is representative flowchart illustrating a method of fabrication of a SONOS based non-volatile memory device 1000 having HKMGs, such as NVM cell 600 including SONOS transistor 326 and select transistor 327, as best shown in FIG. 6, according to an embodiment of the present disclosure. Referring to FIGS. 9A, the process may continue from the embodiment illustrated in FIG. 5H wherein SONOS trench 550 was formed in NVM array recess 552 or the embodiment illustrated in FIG. 8B wherein no SONOS trench 550 was formed. It will be the understanding that, process flow illustrated in FIGS. 9A, 9B, and 10A-10G may be adopted for SONOS based NVM device 1000 whether NVM transistors 326 are formed within SONOS trench 550, or not. In one embodiment, NVM device 1000 is similar to NVM device 300 in FIG. 3 in which both NVM array(s) and logic devices are disposed within a single substrate.

Figure 9B:
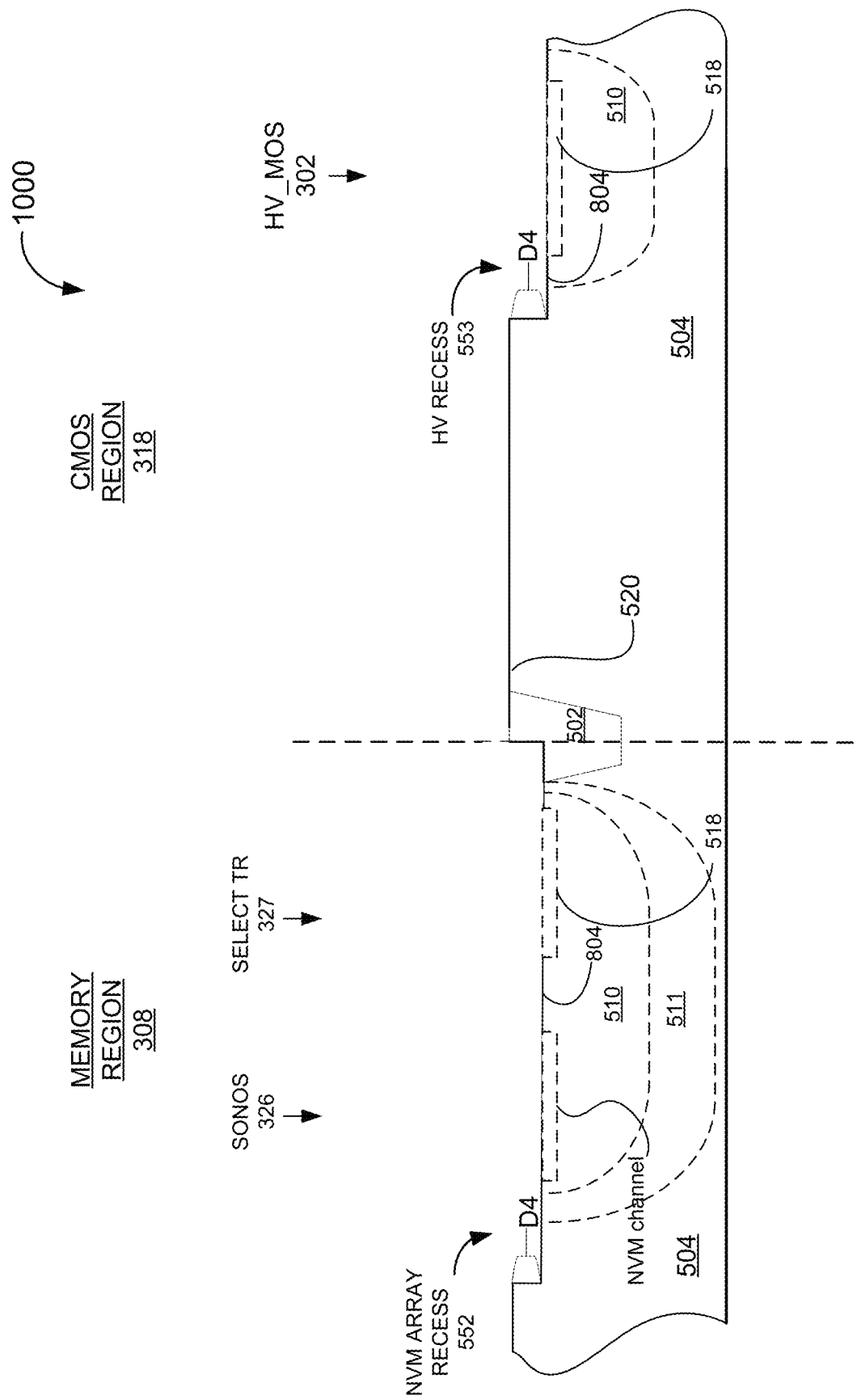
FIG. 9B is a block diagram illustrating a cross-sectional side view of a SONOS based non-volatile memory transistor or device formed in recess(es)

Referring to FIGS. 9A and 9B, the process may include forming multiple features within substrate 504, in step 948. In one embodiment, the process may begin with forming a number of isolation structures or shallow trench isolation (STI) 502 in a wafer or substrate 504 (step 948). STIs 502 isolate the memory cell being formed from memory cells formed in adjoining areas (not shown) of the substrate 504. Optionally and additionally, isolation structures 502 may be incorporated to isolate the NVM transistor(s) 326 being formed from the HV select transistor(s) 327 in the memory region 308 of the substrate 504 and from one or more of the MOS transistors including HV_MOS 312. I/O_MOS 314, and LV_MOS 316, being formed in the CMOS region 318. In embodiments, isolation structures 502 may be formed to isolate HV_MOS area 302, I/O_MOS area 304, and LV_MOS area 306 from one another and/or those areas to isolate formed transistors therein. It will be the understanding that isolation structures 502 may be formed anywhere in substrate 504 according to system design and requirements, and are not limited to those being shown or not shown in FIG. 9B and following figures. In one embodiment, the isolation structures 502 may include a dielectric material, such as oxide or nitride, and may be formed by any conventional technique, including but not limited to shallow trench isolation (STI) or local oxidation of silicon (LOCOS). In one embodiment, pad oxide (not shown) may be formed to cover the entire surface of substrate 504. Pad oxide may be silicon dioxide ($SiO_2$) having a thickness of from about 10 nanometers (nm) to about 20 nm or other thicknesses and may be grown by a thermal oxidation process or in-situ steam generation (ISSG) process, or other oxidation or deposition processes known in the art. It will be the understanding that pad oxide may not be necessary, or formed in some embodiments.

Next, dopants are then implanted into substrate 504 through pad oxide (if present) to form wells in which the NVM transistor(s) and/or the HV_MOS transistors may be formed, and channels for the HV_MOS transistors or other MOS transistors (step 948). According to system design, there may or may not be isolation structures 502 disposed between the first region 308 and the second region 318. The dopants implanted may be of any type and concentration, and may be implanted at any energy, including energies necessary to form wells 510 or deep wells 511 for the NVM transistors and/or the HV_MOS transistors, and to form channels 518 for the HV_MOS transistors. In one particular embodiment, illustrated in FIG. 9B as an example, dopants of an appropriate ion species are implanted to form a P-well 510 in the second region 318 over or in HV_MOS transistor area 302, in which one or more N-type or N-channel transistor, may be formed. In other embodiments, wells or deep wells may also be formed for the NVM array 100 including eventual SONOS 326 and/or select transistor 327 in the first region 308. It is further appreciated that the wells, such as P-well 510, may be formed by depositing and patterning a mask layer, such as a photoresist layer above surface of substrate 504, and implanting an appropriate ion species at an appropriate energy to an appropriate concentration. It would be the understanding that there may be both P-type and/or N-type transistors in first region 308 and/or second region 318, and dopants implantation conditions may be adjusted accordingly. The locations, quantity, and types of NVM transistor(s) 326, select transistors) 327, HV_MOS 312, I/O_MOS 314, and LV_MOS 316 illustrated in FIG. 9B and other figures are merely for illustrative purposes, and should not be construed as limitations. One having ordinary skill in the art would understand and appreciate that multiple first and second regions, MOS areas 302, 304, 306 may be formed within substrate 504. One or more respective NVM transistor 326, select transistor 327, HV_MOS 312, I/O_MOS 314, and LV_MOS 316 may be formed concurrently, or subsequently, or in groups using the process steps disclosed in the present disclosure.

In one embodiment, channels 518 for one or more of select transistor 327 in the first region 308 and HV_MOS transistors 312 in the second region 318 of substrate 504 may be formed. It will be the understanding that channels 518 of select 327 and HV_MOS 312 transistors may or may not be formed concurrently. As with the well implant, channels 518 may be formed by depositing and patterning a mask layer, such as a photoresist layer above the surface of substrate 504, and implanting an appropriate ion species at an appropriate energy to an appropriate concentration. It is appreciated that implantation may also be used to form channels, in all three of the MOS areas 302, 304, and 306 at the same time, or at separate times using standard lithographic techniques, including a patterned photoresist layer to mask one of the channels for the MOS transistors 312, 314, 316. It will be the understanding that one or more of the aforementioned STI formation, channels formation, wells/deep wells formation, for one or more devices may be carried out after those devices, such as NVM transistor 326, select transistor 327. MOS transistors 312, 314, 316, are formed, in step 966.

Figure 10A:
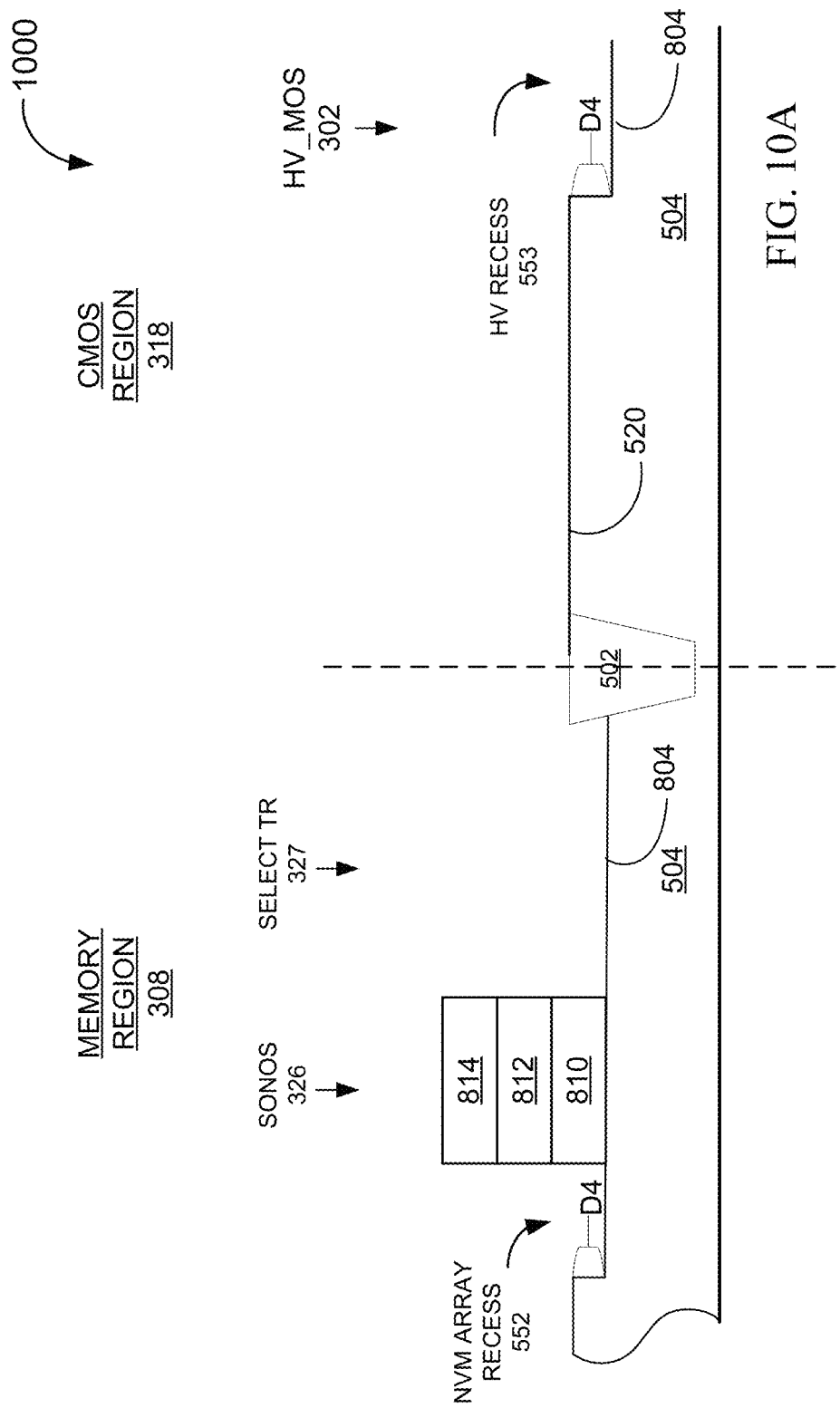
FIGS. 10A-10G are representative diagrams illustrating cross-sectional views of a portion of a 2T memory cell and CMOS devices during fabrication according to the process flow in FIG. 9A.

Referring to FIGS. 9 and 10A, a number of dielectric layers including tunnel dielectric 810, charge-trapping layer 812, and blocking dielectric 814 are formed and patterned in NVM array recess 552, in step 950. In embodiments, the patterned dielectric layers (810, 812, 814) may be formed in SONOS trench 550 (not shown) if present or merely within NVM array recess 552 at depth D4. In one embodiment, tunnel dielectric 810, charge-trapping layer 812, and blocking dielectric 814 are firstly formed overlying both memory region 308 and CMOS region 318 and then patterned to remove completely in areas outside SONOS transistor 326 area. The total height of the patterned dielectric layers (810, 812, 814) may be in an approximate range of 120 Å to 150 Å, or other thicknesses.

In one embodiment, the tunnel dielectric 810 may be any material and have any thickness suitable to allow charge carriers to tunnel into an overlying charge-trapping layer 812 under an applied gate bias while maintaining a suitable barrier to leakage when NVM transistor 326 is unbiased. In some embodiments, tunnel dielectric 810 may be silicon dioxide, silicon oxy-nitride, or a combination thereof and may be grown by a thermal oxidation process, using ISSG or radical oxidation. In embodiments, charge-trapping layer 812 may be a single or multi-layer charge-trapping layer 812 comprising multiple layers including at least a lower or first charge-trapping layer which is physically closer to the tunnel dielectric 810, and an upper or second charge-trapping layer that is oxygen-lean relative to the first charge-trapping layer, and comprises a majority of a charge traps distributed in multi-layer charge-trapping layer 812. In one embodiment, the first and second charge-trapping layers of multi-layer charge-trapping layer 812 may include a silicon nitride or silicon oxy-nitride layer having a stoichiometric ratio of oxygen, nitrogen and/or silicon that are different from one another. In another embodiment, there may be a thin dielectric and/or oxide layer formed between the first and second charge-trapping layers, making the charge-trapping layer 812 a nitride-oxide-nitride (NON) layer. In one embodiment, blocking dielectric 814 may be any material and have any thickness suitable to insulate charge-trapping layer 812 from the gate of NVM transistor 326. In some embodiments, blocking dielectric 814 may be silicon dioxide, silicon oxy-nitride, or a combination thereof and may be grown by a thermal oxidation process, using ISSG or radical oxidation, or conventional deposition processes known in the art.

As best shown in FIG. 10A, in one embodiment, the patterning step may stop at top surface 804 in memory region 308, top surface 520 in CMOS region 318, or top surface 804 in HV_MOS area 302. The patterning step may include using a photoresist layer patterned using standard lithographic techniques, and the NV dielectric layers (810, 812, 814) outside NVM transistor 326 are may be etched or removed using a dry etch process including one or more separate steps to stop on substrate 504 surfaces (520 and 804).

Figure 10B:
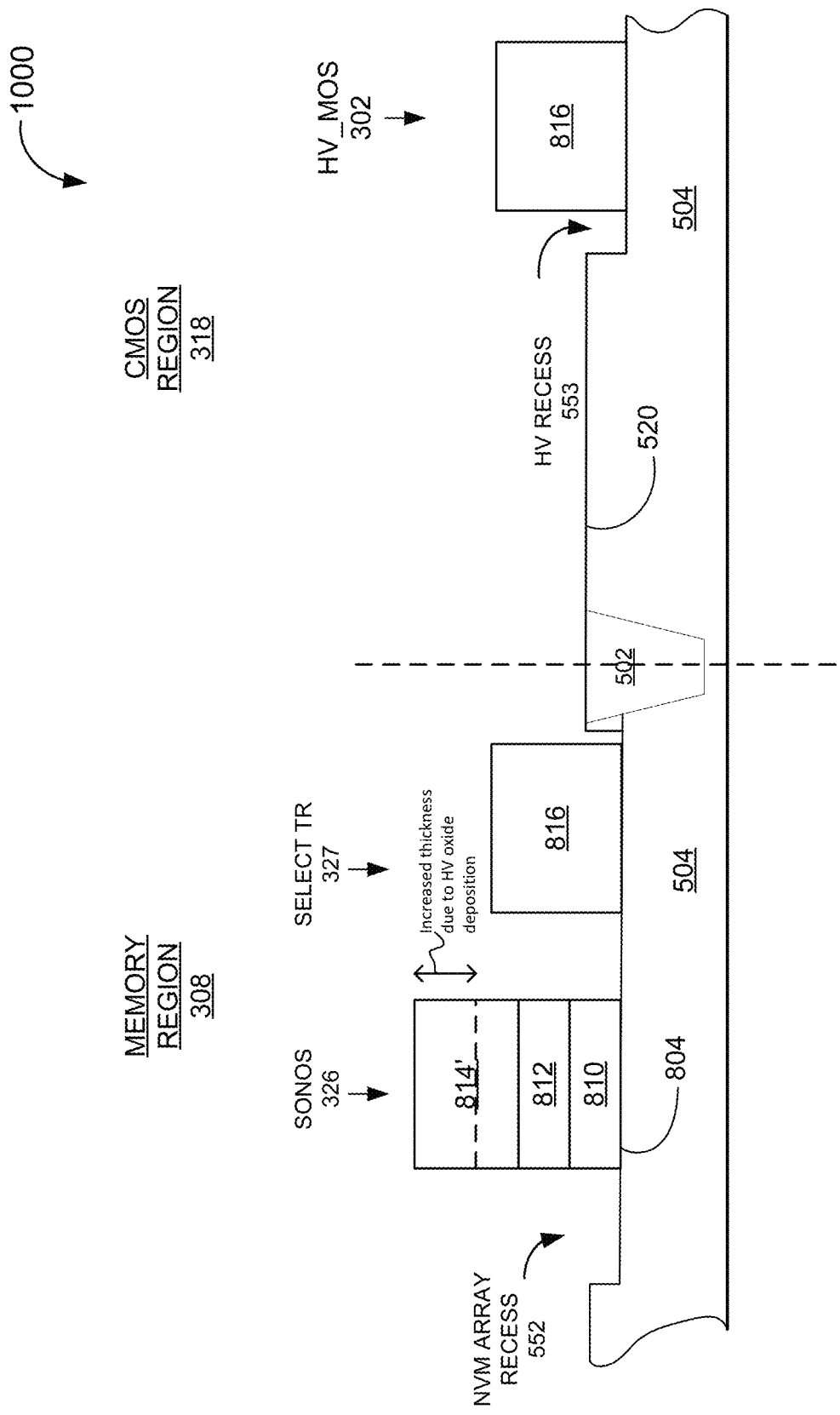

Next, referring to FIGS. 9 and 10B, HV gate dielectric layer 816 may be a silicon oxide layer formed in select transistor 327 area in NVM array recess 552, or HV_MOS area 302 in HV recess 553, in step 952. In one embodiment, HV gate dielectric layer 816 may be formed overlying the entirety of substrate 504 in a single in-situ atomic layer deposition (ALD) chamber that is capable of thermal ALD or plasma-enhanced ALD (PEALD), using either a batch or single tool. In one embodiment, chlorosilane such as hexachlorodisilane $Si_2Cl_6$ (HCD) may be the precursor or silicon source gas. Hydrogen ($H_2$) and oxygen ($O_2$) gas is flown into the ALD chamber at a ratio to one another of approximately 1:4 without an external ignition event, such as forming of a plasma. The $H_2$ and $O_2$ are permitted to react at a temperature approximately in the range of about 300° C. to about 400° C. at a pressure approximately in the range of about 0.5 Torr to about 10 Torr to form radicals, such as, an OH radical, an $HO_2$ radical or an O diradical, eventually react with HCD to form the deposited silicon oxide over the surface of substrate 504. The sequential, self-limiting surface reaction characteristics of ALD deposition and uniformity control with atomic-scale precision at a relatively low thermal budget (such as below 650° C.) allows HV gate dielectric layer 816 to be formed without or with minimal reaction with silicon in substrate 504. Consequently, HV gate dielectric layer 816 is formed substantially above substrate surface 804 in NVM array recess 552 or HV recess 553 (if present), and would not adversely enlarge the height difference between NV dielectric layers (810, 812, 814) of NVM transistor 326 and HV gate dielectric layer 816 of select transistor 327 or HV_MOS 312. In another embodiment, HV gate dielectric layer 816 may also be formed by chemical vapor deposition or physical vapor deposition or other oxide deposition methods to avoid reaction with or consumption of substrate 504. Next, HV gate dielectric layer 816 is patterned to form gate dielectric for HV_MOS 312 and select transistor 327.

Figure 10C:
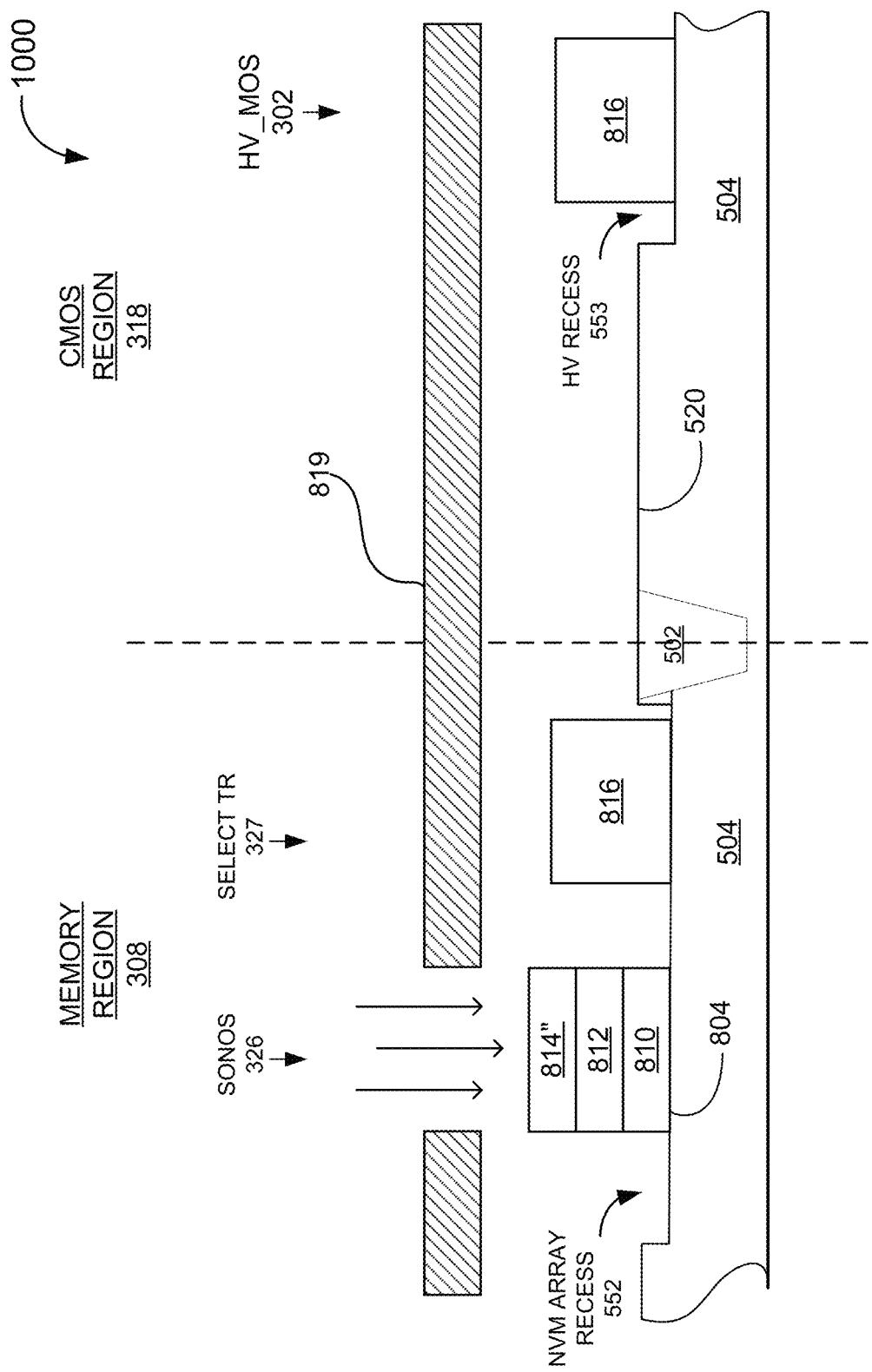

As best shown in FIG. 10B, since NVM transistor's 326 dielectric layers (810, 812, 814) are also exposed to deposition process of HV gate dielectric layer 816, thickness of blocking dielectric 814' may increase due to deposition of HV gate dielectric layer 816 thereon. Next, referring to FIG. 10C, blocking dielectric 814" is thinned or etched down, in step 952. In one embodiment, the thinning step may include using a photoresist layer 819 patterned using standard lithographic techniques to expose NVM dielectric layers (810, 812, 814') of NVM transistor 326, as best shown in FIGS. 10B and 10C. The blocking dielectric thinning process may involve, for example a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. In one embodiment, the wet clean process is calibrated or time controlled such that a pre-determined or ideal thickness of blocking dielectric 814" in an approximate range of 20 Å to 50 Å, or other thicknesses remains. The oxide thinning process may keep blocking dielectric 814" within operational thickness while reducing the overall height difference between NV dielectric layers (810, 812, 814") of NVM transistor 326 and HV gate dielectric layer 816 of select transistor 327 or HV_MOS 312. Alternatively, blocking dielectric 814" may be thinned down by plasma etch, chemical etch, or other etching process(es) known in the art. HV dielectric layers 816 in select transistor 327 or HV_MOS 312 may be patterned such that HV dielectric layer 816 deposited in CMOS region 318 may be removed completely or partially.

Figure 10D:
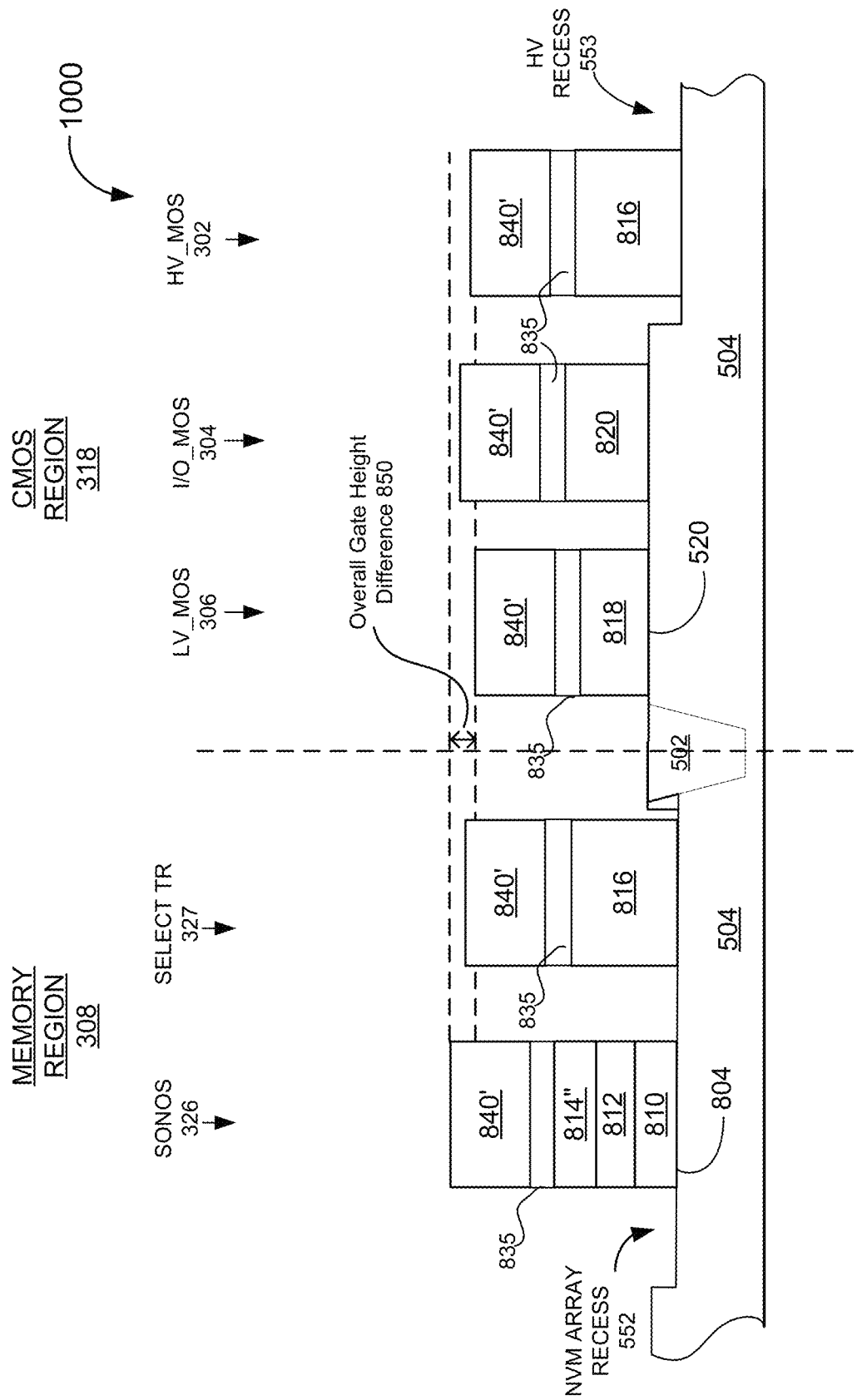

Next, referring to FIGS. 9 and 10D, gate dielectric of I/O_MOS and LV_MOS are formed and patterned in CMOS region 318, in step 952. In embodiments, I/O dielectric 820 and LV dielectric 818 may be silicon dioxide, silicon oxynitride, or a combination thereof and may be grown by a thermal oxidation process, using ISSG or radical oxidation, ALD or conventional deposition processes known in the art. In embodiments, thicknesses of LV gate oxide layer 818, I/O gate oxide layer 820, and HV gate oxide layer 816 are in ascending order; and each type of transistors' oxide layer may be formed simultaneously or individually. Subsequently and best shown in FIG. 10D, LV gate oxide layer 818, I/O gate oxide layer 820, and HV gate oxide layer 816 are patterned, in step 954. Although only one of each type of transistors (SONOS NVM, pass, HV MOS, I/O MOS, LV MOS transistors) are shown, it will be the understanding that multiple transistors of each type (not shown in FIG. 10D) may be fabricated simultaneously or subsequently using the aforementioned method and process steps. As best shown in FIG. 10D, I/O dielectric 820 and LV dielectric 818 are formed outside of NVM array recess 552 or HV recess 553 (if present) such that overall gate height difference 850 among all devices are maintained in a minimal range of less than 50 Å. NVM gate stack 850, when formed in SONOS trench 550 as best shown in FIG. 6 (not shown in FIG. 10D), may further equalize gate height with other devices, including select transistor 327 and devices (312, 314, 316) in CMOS region 318, or reduce overall gate height difference 850.

Still referring to FIGS. 9A and 10D, a high dielectric constant or high-K dielectric material or layer 835 is formed or deposited on or over blocking dielectric 814" of NVM transistor 326 and I-IV gate oxide 816 of select transistor 327, in first region 308 and in second region 318 (step 956). The high-K dielectric layer 835 may include, but is not limited to, hafnium oxide, zirconium oxide, hafnium silicate, hafnium oxy-nitride, hafnium zirconium oxide and lanthanum oxide deposited to a physical thickness between about 3.0 nm and about 8.0 nm or other thicknesses by, for example, atomic layer deposition (ALD), physical vapor deposition (PVD), a chemical vapor deposition (CVD), a low pressure CVD (LPCVD) or a plasma enhanced CVD (PECVD) process.

As best shown in FIG. 10D, a polysilicon or poly gate layer 840 is deposited or formed over substantially the entire surface of the substrate 504 or at least in both the first and second regions 308 and 318, and all layers and structures formed thereon (step 956). In one embodiment, polysilicon gate layer 840 may be formed by chemical vapor deposition (CVD) to a thickness of from about 30 nm to about 100 nm, or other appropriate thicknesses. In other embodiments, polysilicon or poly gate layer 840 may be formed by other deposition methods or fabrication methods known in the art. In one alternative embodiment, prior to poly gate layer 840 deposition, a thin layer of titanium nitride (not shown in this figure) is deposited, and poly gate layer 840 may be deposited overlying the thin titanium nitride layer. The titanium nitride deposition is optional, and may facilitate subsequent poly gate layer patterning or removal. In one embodiment, poly gate layer 840 may be deposited conformally and then patterned to form sacrificial or dummy polysilicon gates 840' for all devices in memory region 308 and CMOS region 318, in step 958.

Figure 10E:
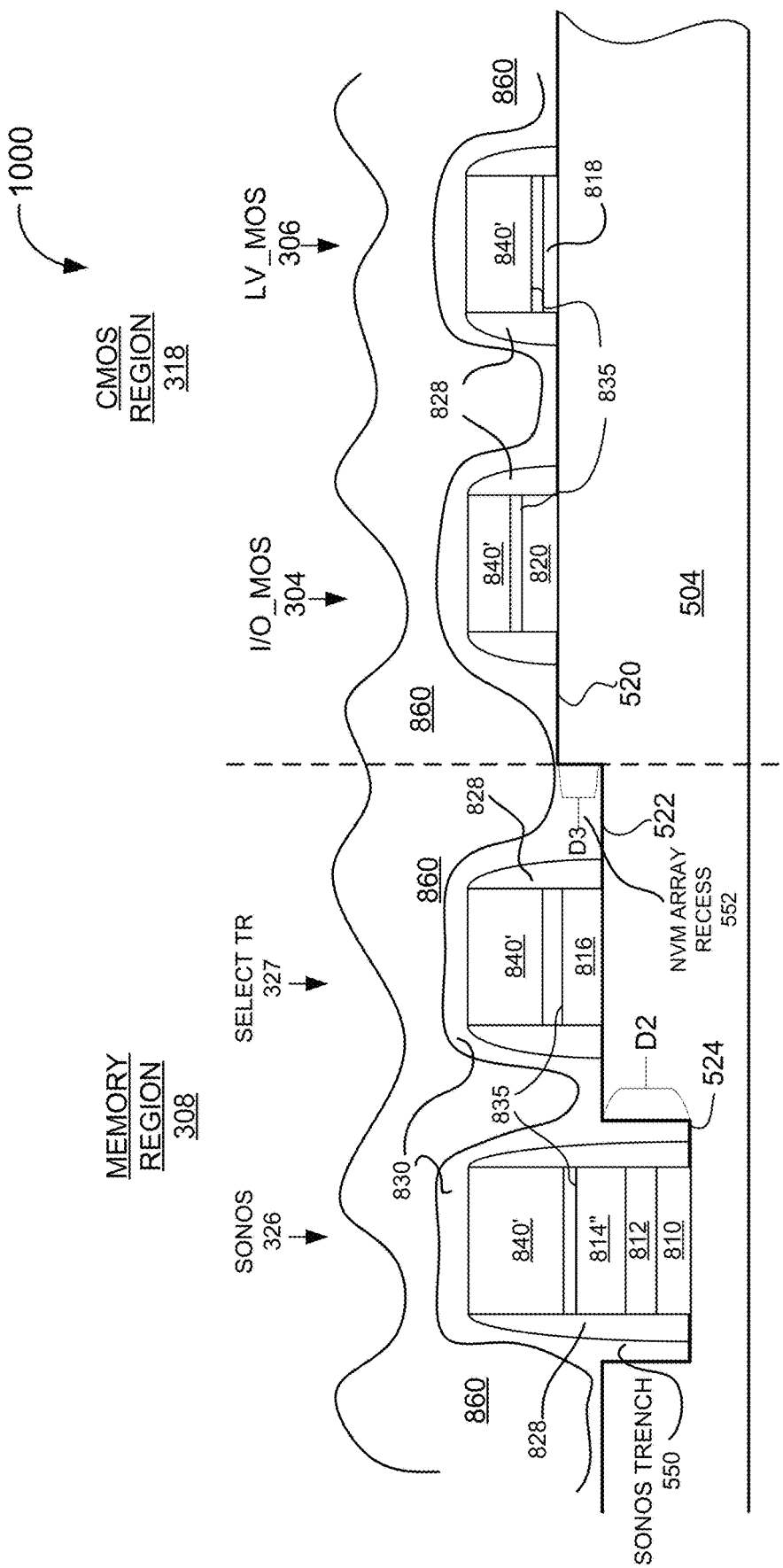

Next, referring to FIGS. 9 and 10E, a spacer layer is deposited and etched to form sidewall spacers or offset spacers 828 adjacent to dummy or sacrificial polysilicon gates 840' of MOS transistors 312, 314, 316, select transistor 327, and NVM transistor 326 (step 958). In one embodiment, the spacer layer may include silicon oxide or silicon nitride, deposited to a thickness of from about 5 nm to about 20 nm, using any known CVD technique as described herein. In another embodiments, sidewall spacers 828 may include multi-layers of different dielectric materials.

Referring to FIGS. 9 and 10E, the method further includes forming a stress inducing liner or layer 830, such as a stress inducing nitride layer, and depositing an interlevel dielectric (ILD) layer 860 over substantially the entire surfaces 520, 522, and 524 of substrate 504 and all layers and structures formed thereon, and the ILD layer 860 planarized, for example, using a chemical-mechanical polishing (CMP) process (step 958). The stress inducing layer 830 may include, a compressive or tensile nitride layer formed using a plasma enhanced chemical vapor deposition (PECVD) or a Bis-TertiaryButylAmino Silane (BTBAS) nitride layer, deposited or grown to a thickness of from about 30 nm to about 70 nm or other thicknesses, using any known technique including chemical vapor deposition. The ILD layer 860 may include, for example, silicon nitride or silicon oxide, deposited or grown to a thickness of from about 0.5 µm to about 1.0 µm or other thicknesses, using any known CVD technique as described above.

Figure 10F:
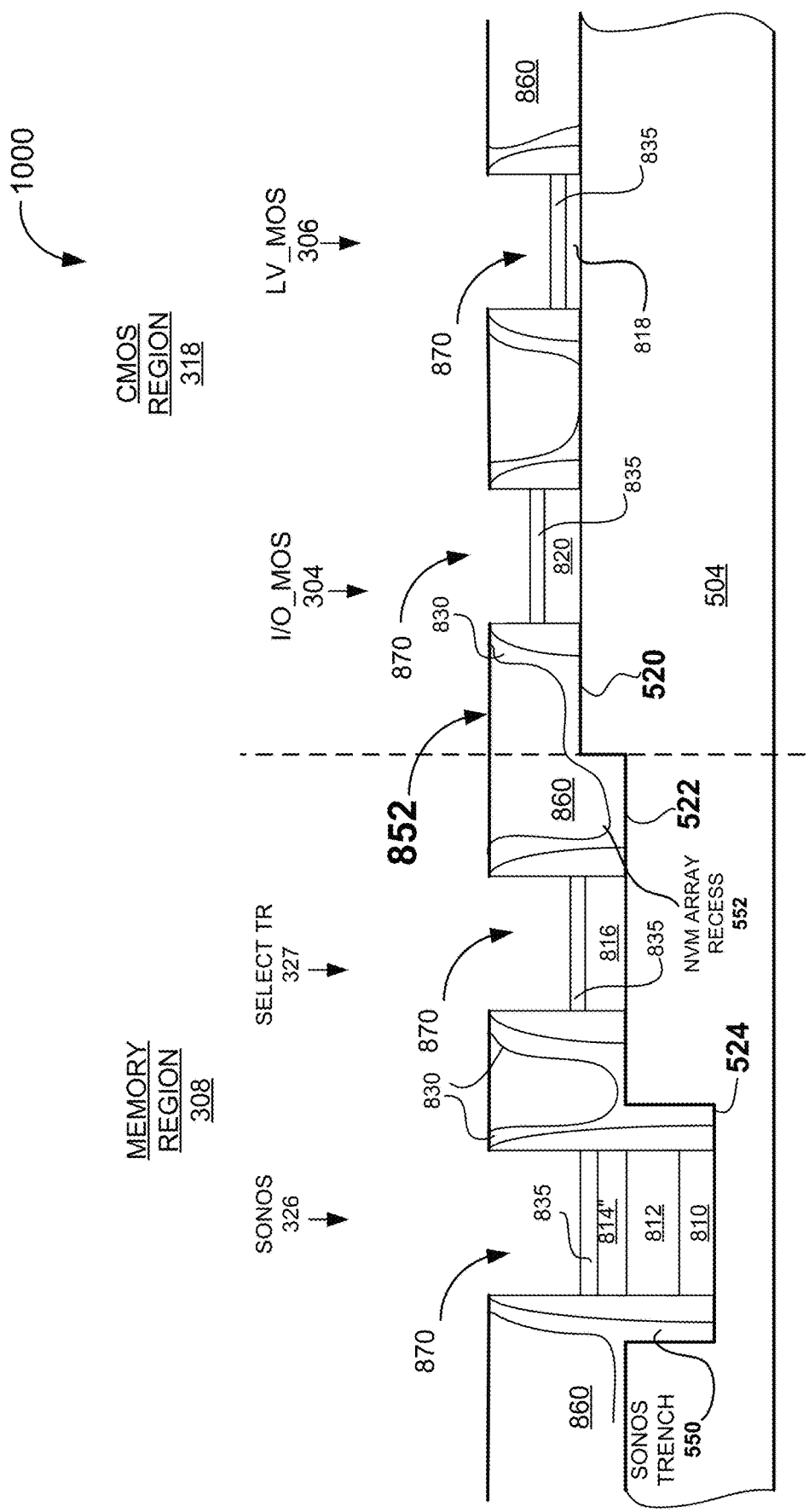

Next, referring to FIG. 10F, a chemical mechanical planarization (CMP) process may be performed to expose sacrificial polysilicon gates 840 in NVM transistor 326 and select transistor 327 in the first region 308, and MOS transistors 312 (not shown). 314, and 316 in the second region 318. As best illustrated in FIG. 10F, a single CMP process is performed to expose all targeted dummy polysilicon gates 840'. As previously explained, gate height of various transistors or elevation differences of top surfaces of various transistors, e.g. NVM 326, select 327, and HV_MOS 312, or I/O_MOS 314 and LV_MOS 316 may be equalized or greatly reduced by the presence of SONOS trench 550 and/or NVM array recess 552 and/or HV recess 553, as best shown in FIG. 10D. Therefore, ILD material and SiN residue issues and their corresponding effects may be reduced or minimized during the CMP process step. Due to the possible difference in gate heights, different transistors may have different thicknesses of remaining dummy poly gates 840' after the CMP process step. In another embodiment, due to the potential difference in total gate heights of various transistors, multiple CMP processes may be employed such that all targeted dummy polysilicon gates 840' are exposed.

Referring to FIGS. 9 and 10F, dummy polysilicon gates 840' are removed (step 960). In one embodiment, dummy polysilicon gates 840' may be removed to create gate openings 870 using standard polysilicon etch chemistries, such as CHF3 or C2H2 or HBr/O2 and methods that are known in the art, which are highly selective to the material of ILD layer 860, stress inducing liner 830, sidewall spacers 828. In an alternative embodiment, one or more dummy polysilicon gate 840' in NVM transistor 326, select transistor 327 and/or MOS transistors 312, 314, and 316 may not be removed, in cases wherein a polysilicon gate is preferred over a metal gate. In the embodiment wherein the thin titanium nitride is present, the polysilicon etch may stop at the thin titanium nitride layer (not shown) instead. In one embodiment, the polysilicon etch process may stop at hi-K dielectric layer 835, as best shown in FIG. 10F.

Figure 10G:
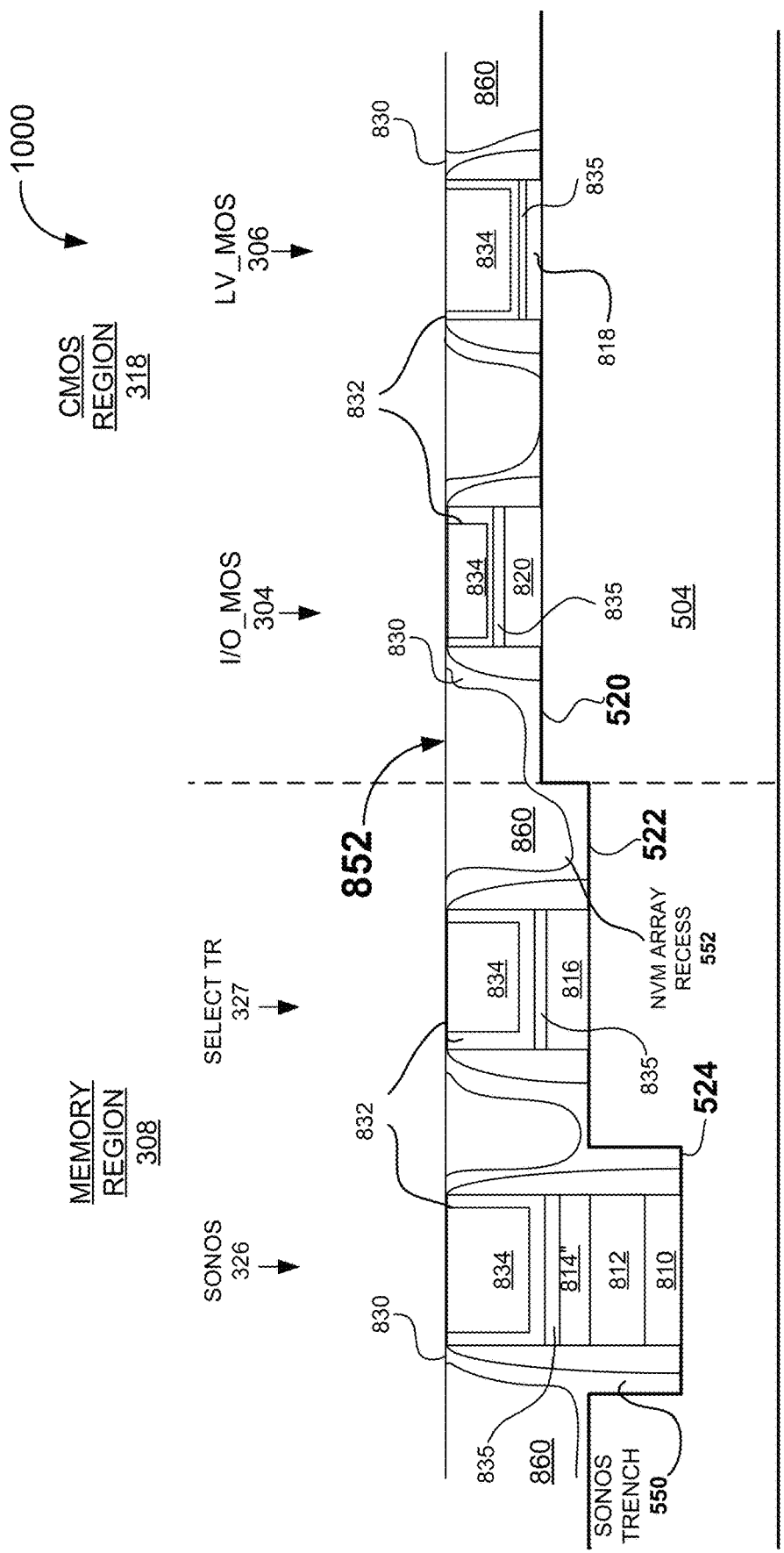

Next, referring to FIGS. 9 and 10G, first metal layers 832 of multi-layer metal gates are formed, (step 962). In one embodiment, the multi-layer metal gates may replace the removed dummy polysilicon gates 840 in gate openings 870. First metal layer 832 is deposited over substantially the entire surface of the substrate 504 and all layers and structures formed thereon, a patterned photoresist mask (not shown) formed using standard lithographic techniques to remove first metal layer 832 outside of gate openings 870 in first and second regions 308 and 318. As best shown in FIG. 10G, first metal layer 832 may be formed overlying high-K dielectric layers 835, and optionally on sidewalls, of gate openings 870 previously occupied by dummy polysilicon gates 840'. In embodiments, first metal layers 832 may be P+ metal layer (high work function metal) that may include aluminum, titanium or compounds or alloys thereof, deposited to a thickness of from about 20 nm to about 100 nm or other thicknesses, using physical or chemical vapor deposition. P+ metal may form high function gate for any P-type NVM transistor(s) and P-type MOS transistor(s). In other embodiments, first metal layers 832 may include N+ metal layer deposited and etched to form a non-high or low work function metal gate for any N-type transistors in the first and second regions 308 and 318. N+ metal may include titanium, lanthanum, aluminum, or compounds or alloys thereof, deposited to a thickness of from about 20 nm to about 100 nm or other thicknesses, using physical or chemical vapor deposition. The incorporation of the high work function metal layer in N-type NVM transistor 326 may provide improved erase performance to the device as it may avoid erase saturation. In the embodiment wherein the thin titanium nitride layer is present, P+ or N+ first metal layer may be deposited overlying the thin titanium nitride layer. Since the titanium nitride layer is very thin, it may not affect the property of the finished metal gates significantly. In one alternative embodiment, prior to forming of P+ or N+ first metal layer 832, a layer of tantalum nitride is deposited overlying the thin layer of titanium nitride (if present). The thin layer of titanium nitride and tantalum nitride will form a bottom barrier metal layer. As discussed, the bottom barrier metal layer disposed between P+ or N+ first metal layer 832 and high-K dielectric layer 835 is optional.

Still referring to FIG. 10G, thick gate metal layer is deposited, etched and may be followed by planarization using a CMP process or multiple CMP processes to form thick metal gates 834, completing the formation of multi-layer metal gates for the NVM transistor 326, select transistor 327, and all of the MOS transistors 312, 314, and 316 (step 962). In one embodiment, thick gate metal layer may include a conformal layer of aluminum, titanium, titanium-nitride, tungsten or compounds or alloys thereof, overlying its respective P+ or N+ first metal layer 832. Thick gate metal layer 834 may be deposited to a thickness of from about 0.1 μm to about 0.5 μm or other thicknesses, using physical or chemical vapor deposition, or other deposition methods known in the art. In one embodiment. NVM transistor 326, may also be referred to as Metal-Oxide-Nitride-Oxide-Semiconductor (MONOS) transistor because of the presence of multilayer metal gate (first metal layer 832 and thick gate metal layer 834). It will be the understanding that NVM. SONOS and MONOS are used interchangeably throughout the entire patent document. Optionally, a metal polish process may be applied to level out or planarize the top surfaces 852 of thick gate metal layer 834 of NVM transistor 326, select transistor 327, and MOS transistors 312, 314, and 316 (step 964). In one alternative embodiment, prior to forming of thick gate metal layer 834, a top barrier metal layer (not shown in this figure) including titanium nitride and titanium, may be formed overlying P+ or N+ first metal layer 832. In one embodiment, the top barrier metal layer is optional.

As best shown in FIG. 10G, SONOS based NV M device 1000 that includes NVM transistor 326, select transistor 327, HV, I/O, and LV transistors 316, 314, and 312 may have a planarized top surface 852 after the aforementioned CMP process. In one embodiment, the planarized top surface 852 is substantially co-planar or flat despite having devices of different gate oxide thicknesses. In embodiments, as previously mentioned, NVM transistor 326 may be formed within SONOS trench 550, as best shown in FIG. 10G. In other embodiments. SONOS trench 550 may not be formed and NVM transistor 326 is formed in NVM array recess 552 with select transistor 327, as best shown in FIG. 10D. In yet other embodiments. HV recess 553 may or may not be present. It is the understanding that process flow illustrated and detailed in FIGS. 9A-10G may be adopted in all of the above-mentioned embodiments.

Finally, the standard or baseline CMOS process flow is continued to substantially complete the front end device fabrication (step 966). The process flow may include forming HKMGs, spacers, channels, source/drain regions, etc. for each type of transistors. In one embodiment, completed NVM transistor 326 and HV, I/O or LV MOS transistor 312, 314, 316 may be configured to form an embodiment of a NVM cell 600 inside NVM array recess 552. In alternative embodiments, pass transistor 327 may have a different structure, such as gate oxide thickness, from HV, I/O or LV MOS transistor 312, 314, 316. In another alternative embodiment, memory cell 600 may only contain NVM transistor 326 in a one transistor configuration.

Thus, embodiments of a SONOS based non-volatile memory having HKMG and methods of fabrication including equalized gate heights and methods of integration to a baseline CMOS process flow are presented. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

What is claimed is:

1. A method of fabrication of a semiconductor device, comprising:
    dividing a substrate into first and second regions;
    forming a first recess to a first depth in the first region;
    forming a non-volatile memory (NVM) transistor and a select transistor at least partly within the first recess, further comprising:
    forming a non-volatile (NV) dielectric stack in the first recess, wherein the NV dielectric stack includes a blocking oxide disposed over a charge-trapping layer and a tunnel oxide;
    performing at least one silicon oxide deposition process in an atomic layer deposition (ALD) tool to form a gate dielectric layer of the select transistor adjacent to the NV dielectric stack in the first recess;
    performing an oxide removal process step to thin out a thickness of the blocking oxide of the NV dielectric stack;
    forming a high-K dielectric layer overlying the blocking oxide and the gate dielectric layer respectively;
    forming a sacrificial polysilicon gate over the high-K dielectric layers of the NV dielectric stack and the gate dielectric layer respectively; and
    replacing the sacrificial polysilicon gates with metal gates.

2. The method of claim 1, wherein the NVM transistor and the select transistor are configured to form a two-transistor (2T) NVM cell.

3. The method of claim 1, wherein the forming the first recess further comprises:
    patterning a photo-resist to expose the first region;
    performing an oxidation process, wherein the oxidation process consumes a top portion of the substrate in the first region to form a first recess oxide layer to the first depth within the substrate; and
    performing an oxide cleaning process to remove the first recess oxide layer completely in the first region.

4. The method of claim 1, wherein the oxide removal process step of the NV dielectric stack further includes:
    patterning a photo-resist to expose the NV dielectric stack;
    performing an oxide cleaning process on the blocking oxide; and
    calibrating the oxide cleaning process to control the thickness of the blocking oxide.

5. The method of claim 4, wherein the gate dielectric layer formed by the at least one silicon oxide deposition process is substantially deposited above a top surface of the substrate in the first recess.

6. The method of claim 1, wherein elevation of top surfaces of the sacrificial polysilicon gates of the NVM transistor and the select transistor has a height difference of less than 50 Å.

7. The method of claim 1, wherein the replacing the sacrificial polysilicon gates further includes:
    forming a stress inducing silicon nitride layer and an interlevel dielectric layer (ILD) overlying the substrate in the first region;
    performing a first chemical-mechanical polishing (CMP) process until at least one of the sacrificial polysilicon gates of the NVM transistor and the select transistor is exposed;
    performing a polysilicon etch to remove the sacrificial polysilicon gates in the NVM transistor and the select transistor to create gate openings;
    forming a metal gate overlying each of the high-K dielectric layers; and
    performing a second CMP process to equalize gate heights of the NVM transistor and select transistor.

8. The method of claim 1, wherein elevation of top surfaces of the metal gates of the NVM transistor and the select transistor is substantially coplanar.

9. The method of claim 1, further comprising:
    forming an input/output (I/O) transistor, a low-voltage (LV) transistor, a high-voltage (HV) transistor outside of the first recess in the second region, wherein a gate dielectric layer of the HV transistor is thicker than a gate dielectric layer of the I/O transistor, the gate dielectric of the I/O transistor is thicker than a gate dielectric layer of the LV transistor, wherein each of the HV, I/O, and LV transistors include a high-K metal gate, and wherein elevation of top surfaces of the high-K metal gates of the NVM and select transistors disposed within the first recess and top surfaces of the high-K metal gates of the HV, I/O, and LV transistors disposed outside the first recess is substantially coplanar.

10. The method of claim 9, further comprising:
    forming a second recess to the first depth in the second region concurrently with the first recess, wherein the select transistor and the HV transistor have same structural features, and wherein the HV transistor is formed within the second recess.

11. The method of claim 1, further comprising:
    forming a second recess to a second depth within the first recess in the first region; and
    forming the NVM transistor within the second recess, wherein the second depth is larger than the first depth and the select transistor is formed outside the second recess.

12. A method of fabrication of a semiconductor device, comprising:
    dividing a substrate into first and second regions;
    forming a first recess to a first depth in the first region;
    forming a second recess to a second depth in the first recess, wherein the second depth is larger than the first depth;
    forming a non-volatile memory (NVM) transistor and a select transistor in the first recess, further comprising:
    forming a non-volatile (NV) dielectric stack at least partly in the second recess, wherein the NV dielectric stack includes a blocking oxide disposed over a charge-trapping layer and a tunnel oxide; and
    forming a gate dielectric layer of the select transistor adjacent to the NV dielectric stack and outside of the second recess;
    forming a high-voltage (HV) transistor, an input/output (I/O) transistor, and a low-voltage (LV) transistor, each comprising a gate dielectric layer, in the second region outside of the first recess;

forming a hi-K dielectric layer overlying each of the NV dielectric stack and gate dielectric layer of the select, HV, I/O, and LV transistors, respectively;

forming sacrificial polysilicon gates overlying the hi-K dielectric layers; and replacing the sacrificial polysilicon gates with metal gates, wherein elevation of top surfaces of the metal gates of the NVM and select transistors in the first region and top surfaces of the metal gates of the HV, I/O, and LV transistors in the second region is substantially the same.

13. The method of claim 12, wherein the NVM transistor and the select transistor are configured to form a two-transistor (2T) NVM cell.

14. The method of claim 12, wherein the forming the first recess further comprises:

patterning a photo-resist to expose the first region;

performing an oxidation process, wherein the oxidation process consumes a top portion of the substrate in the first region to form a first recess oxide layer to the first depth within the substrate; and performing an oxide cleaning process to remove the first recess oxide layer completely in the first region.

15. The method of claim 12, wherein forming the second recess further comprises:

forming a recess nitride layer overlying a sacrificial oxide layer in the first region;

patterning a photo-resist to expose an NVM area wherein the NVM transistor to be formed;

removing the recess nitride layer in the NVM area;

performing a first oxidation process in the NVM area, wherein the first oxidation process consumes a top portion of the substrate in the NVM area to form a second recess oxide layer within the substrate;

removing the recess nitride layer in the first region;

performing a second oxidation process in the first region, wherein the second oxidation process further grows the second recess oxide layer to the second depth in the substrate; and performing an oxide cleaning process to remove the second recess oxide layer completely in the NVM area.

16. The method of claim 12, wherein the forming the gate dielectric layer of the select transistor further comprises:

performing at least one silicon oxide deposition process in an atomic layer deposition (ALD) tool to form the gate dielectric layer of the select transistor adjacent to the NV dielectric stack in the first recess; and performing an oxide removal process step to reduce a thickness of the blocking oxide of the NV dielectric stack.

17. The method of claim 12, wherein the replacing the sacrificial polysilicon gates further includes:

forming a stress inducing silicon nitride layer and an interlevel dielectric layer (ILD) overlying the substrate in the first region;

performing a first chemical-mechanical polishing (CMP) process until at least one of the sacrificial polysilicon gates of the NVM transistor and the select transistor is exposed;

performing a polysilicon etch to remove the sacrificial polysilicon gates in the NVM transistor and the select transistor to create gate openings;

forming a metal gate overlying each of the high-K dielectric layer; and performing a second CMP process to equalize gate heights of the NVM transistor and select transistor.

18. A method of fabricating a semiconductor memory device, comprising:

dividing a substrate into first and second regions;

forming a first recess to a first depth in the first region;

forming a second recess to a second depth in the first recess, wherein the second depth is larger than the first depth;

forming a third recess of the first depth in the second region;

forming a non-volatile memory (NVM) transistor including a non-volatile (NV) dielectric stack in the second recess, wherein the NV dielectric stack includes a blocking oxide disposed over a charge-trapping layer and a tunnel oxide;

forming a select transistor adjacent to the NVM transistor including a select gate dielectric disposed in the first recess and outside the second recess;

forming high-voltage (HV), input/output (I/O), and low-voltage (LV) transistors, each comprising a gate dielectric layer, in the second region outside the first recess, wherein the HV transistor is disposed within the third recess;

forming a hi-K dielectric layer overlying each of the blocking oxide of the NVM transistor, the select gate dielectric, and the gate dielectric layers of the HV, I/O, and LV transistors; and forming a sacrificial polysilicon gate overlying each of the hi-K dielectric layers.

19. The method of claim 18, wherein elevation of top surfaces of the sacrificial polysilicon gates of the NVM transistor and the select transistor in the first region, and top surfaces of the sacrificial polysilicon gates of the HV, I/O, and LV transistors in the second region has a height difference of less than 50 Å.

20. The method of claim 18, further comprising:

replacing the sacrificial polysilicon gates with metal gates, wherein elevation of top surfaces of the metal gates of the NVM and select transistors in the first region and top surfaces of the high-K metal gates of the HV, I/O, and LV transistors in the second region is substantially the same.

* * * * *